(12) United States Patent
Lindström et al.

(10) Patent No.: US 10,964,486 B2
(45) Date of Patent: Mar. 30, 2021

(54) DYE-SENSITIZED SOLAR CELL UNIT AND A PHOTOVOLTAIC CHARGER INCLUDING THE SOLAR CELL UNIT

(71) Applicant: Exeger Operations AB, Stockholm (SE)

(72) Inventors: Henrik Lindström, Åkersberga (SE); Giovanni Fili, Stockholm (SE)

(73) Assignee: Exeger Operations AB, Stockholm (SE)

( * ) Notice: Subject to any disclaimer, the term of this patent is extended or adjusted under 35 U.S.C. 154(b) by 189 days.

(21) Appl. No.: 16/244,237

(22) Filed: Jan. 10, 2019

(65) Prior Publication Data

US 2019/0148083 A1    May 16, 2019

Related U.S. Application Data

(60) Continuation-in-part of application No. 16/023,189, filed on Jun. 29, 2018, which is a division of
(Continued)

(30) Foreign Application Priority Data

| May 17, 2013 | (SE) | .................................. | 1350611-8 |
| May 16, 2018 | (SE) | .................................. | 1850574-3 |
| Jul. 16, 2018 | (EP) | .................................. | 18183590 |

(51) Int. Cl.
*H01G 9/20* (2006.01)
*H01L 51/42* (2006.01)
(Continued)

(52) U.S. Cl.
CPC ......... *H01G 9/2059* (2013.01); *H01G 9/2018* (2013.01); *H01G 9/2022* (2013.01);
(Continued)

(58) Field of Classification Search
CPC .. H01G 9/2027; H01G 9/2031; H01G 9/2036; H02S 40/30; H02S 40/38
See application file for complete search history.

(56) References Cited

U.S. PATENT DOCUMENTS

| 6,291,763 B1 | 9/2001 | Nakamura | |
| 2008/0083454 A1* | 4/2008 | Park | ........................ B82Y 10/00 |
| | | | 136/258 |

(Continued)

FOREIGN PATENT DOCUMENTS

| CN | 105 449 106 A | 3/2016 |
| EP | 1 624 472 A2 | 2/2006 |

(Continued)

OTHER PUBLICATIONS

English machine translation of Kashiwabara et al. (WO 2010/117062 A1) provided by the EPO website, All Pages, 2020. (Year: 2020).*

(Continued)

*Primary Examiner* — Daniel P Malley, Jr.
(74) *Attorney, Agent, or Firm* — Dilworth & Barrese, LLP

(57) ABSTRACT

The present invention relates to a dye-sensitized solar cell unit (1") comprising a working electrode comprising a light-absorbing layer (10), a porous first conducting layer (12') for extracting photo-generated electrons from the light-absorbing layer (10), wherein the light-absorbing layer (10) is arranged on top of the first conducting layer (12'), a porous insulating layer (105c) made of an insulating material, wherein the porous first conducting layer (12') is arranged on top of the porous insulating layer (105c). The dye-sensitized solar cell unit (1") further comprises a counter electrode comprising a second conducting layer (16) including conducting material, and a porous third conducting layer (106c) disposed between the porous insulating layer (105c) and the
(Continued)

second conducting layer (16), and in electrical contact with the second conducting layer. The dye-sensitized solar cell unit (1″) further comprises a liquid electrolyte for transferring charges between the counter electrode and the working electrode. The second conducting layer (16) is non-catalytic and the third conducting layer (106c) comprises catalytic particles (107″) for improving the transfer of electrons to the liquid electrolyte.

21 Claims, 7 Drawing Sheets

Related U.S. Application Data application No. 14/891,688, filed as application No. PCT/EP2014/060163 on May 16, 2014, now Pat. No. 10,043,614.

(51) Int. Cl.
    *H01L 51/00* (2006.01)
    *H02S 40/38* (2014.01)
(52) U.S. Cl.
    CPC ......... *H01G 9/2031* (2013.01); *H01G 9/2068* (2013.01); *H01L 51/0032* (2013.01); *H01L 51/4226* (2013.01); *H02S 40/38* (2014.12); *H01G 9/2013* (2013.01); *Y02E 10/542* (2013.01); *Y02E 10/549* (2013.01); *Y02P 70/50* (2015.11)

(56) References Cited

U.S. PATENT DOCUMENTS

| | | | |
|---|---|---|---|
| 2009/0146604 A1 | 6/2009 | Choi et al. | |
| 2011/0023932 A1* | 2/2011 | Fukui | H01G 9/2081 136/244 |
| 2011/0139224 A1 | 6/2011 | Krajewski | |
| 2011/0197948 A1 | 8/2011 | Kobayashi et al. | |
| 2011/0232736 A1* | 9/2011 | Goldstein | H01G 9/2077 136/256 |
| 2011/0240116 A1 | 10/2011 | Morooka | |
| 2012/0085402 A1 | 4/2012 | Song et al. | |
| 2012/0305073 A1 | 12/2012 | Hayase et al. | |
| 2013/0199603 A1 | 8/2013 | Snaith et al. | |
| 2013/0269781 A1 | 10/2013 | Ko et al. | |
| 2016/0329737 A1* | 11/2016 | Yamamoto | H02J 7/025 |
| 2019/0148083 A1 | 5/2019 | Lindstrom et al. | |

FOREIGN PATENT DOCUMENTS

| | | | |
|---|---|---|---|
| EP | 2211418 A1 | 7/2010 | |
| EP | 2214249 A1 | 8/2010 | |
| JP | 2011-216190 A | 10/2011 | |
| JP | 2007-324080 A | 12/2013 | |
| KR | 20100138663 A | 12/2010 | |
| KR | 20120036655 A | 4/2012 | |
| WO | 97/16838 A1 | 2/2006 | |
| WO | 2010049042 A2 | 5/2010 | |
| WO | WO-2010117062 A1 * | 10/2010 | .......... H01G 9/2031 |
| WO | 2011/096154 A1 | 8/2011 | |
| WO | 2012/045881 A1 | 4/2012 | |
| WO | 2013/053501 A1 | 4/2013 | |
| WO | WO-2013053501 A1 * | 4/2013 | .......... H01G 9/2027 |
| WO | 2013/149787 A1 | 10/2013 | |
| WO | 2013149789 A2 | 10/2013 | |
| WO | 2013/171520 A1 | 11/2013 | |
| WO | 2014184379 A1 | 11/2014 | |
| WO | 2017155447 A1 | 9/2017 | |

OTHER PUBLICATIONS

STN search U.S. Appl. No. 16/244,237 conducted by the Examiner, All Pages, 2020. (Year: 2020).*

Chung et al, "All-solid-state dye-sensitized solar cells with high efficiency," Nature vol. 485, May 24, 2012, pp. 486-490.

O'Regan et al, "A Solid-State Dye-Sensitized Solar Cell Fabricated with Pressure-Treated P25-TiO2 and CuSCN; Analysis of Pore Filling and IV Characteristics," 2002, Chemical Materials, 14, All Pages.

Lee et al, "Efficient Hybrid Solar Cells Based on Meso-Superstructurred Organometal Halide Perovskites," 2012, Science, vol. 338, All Pages.

\* cited by examiner

DYE-SENSITIZED SOLAR CELL UNIT AND A PHOTOVOLTAIC CHARGER INCLUDING THE SOLAR CELL UNIT

FIELD OF THE INVENTION

The present invention relates to a dye-sensitized solar cell. The present invention also relates to a photovoltaic charger including the solar cell unit.

PRIOR ART

Dye-sensitized solar cells (DSC) have been under development for the last 20 years and work on similar principles as photosynthesis. Unlike silicon solar cells, these cells obtain energy from sunlight using dyes which can be manufactured cheap, environmentally unobtrusive and in abundance.

A conventional sandwich type dye-sensitized solar cell has a few μm thick porous $TiO_2$ electrode layer deposited onto a transparent conducting substrate. The $TiO_2$ electrode comprises interconnected $TiO_2$ metal oxide particles dyed by adsorbing dye molecules on the surface of the $TiO_2$ particles and forming a working electrode. The transparent conducting substrate is normally a transparent conducting oxide deposited onto a glass substrate. The transparent conducting oxide layer serves the function as an electron collector extracting photo-generated electrons from the working electrode. The $TiO_2$ electrode is in contact with an electrolyte and another transparent conducting substrate, i.e. a counter electrode.

Sunlight is harvested by the dye, producing photo-excited electrons that are injected into the conduction band of the $TiO_2$ particles and further collected by the conducting substrate. At the same time, $I^-$ ions in the redox electrolyte reduce the oxidized dye and transport the generated electron acceptor species to the counter electrode. The two conducting substrates are sealed at the edges in order to protect the DSC modules against the surrounding atmosphere, and to prevent the evaporation or leakage of the DSC components inside the cell.

WO 2011/096154 discloses a sandwich type DCS module including a porous insulation substrate, a working electrode including a porous conductive metal layer formed on top of the porous insulation substrate and creating an electron collector in form of a back contact, and a porous semiconductor layer containing an adsorbed dye arranged on top of the porous conductive metal layer, a transparent substrate facing the porous semiconductor layer, adapted to face the sun and to transmit the sun light to the porous semiconductor layer. The DSC module further includes a counter electrode including a conducting substrate arranged on a side opposite to the porous semiconductor layer of the porous insulation substrate, and at a distance from the porous insulation substrate, thereby forming a space between the porous insulation substrate and the conducting substrate. An electrolyte is filled in the space between the working electrode and the counter electrode. An advantage with this type of DSC module is that the conducting layer of the working electrode is arranged between the porous insulation substrate and the porous semiconductor layer. Thus, the conducting layer of the working cell does not have to be transparent and can be made of a material of high conductivity, which increases the current-handling capability of the DSC module and ensures high efficiency of the DSC module.

A prior art monolithic dye-sensitized solar cell comprises a working electrode in the form of a light absorbing layer, a first conducting layer for extracting photo-generated electrons from the light absorbing layer, a porous insulation substrate, and a counter electrode including a second conducting layer arranged on the opposite side of the porous insulation substrate. The light absorbing layer may include a porous metal oxide with light absorbing material deposited on a top side. The porous insulation substrate is, for example, made of a ceramic microfiber. The first conducting layer is a layer of a porous conducting material deposited on one side of the porous insulation substrate. The second conducting layer is a layer of a porous conducting material deposited on the other side of the porous insulation substrate. The first and second conducting layers are, for example, printed on the porous insulation substrate. The porous insulation substrate is electrically insulating. Both conducting layers consist of particles that are large enough to not penetrate the pores of the porous substrate. The substrate serves the function of separating the conducting layers physically and electrically in order to avoid direct electronic short circuit between the conducting layers. Further, to allow the first and second conducting layers to be printed on the porous substrate, the porous substrate should be suitable for printing.

The solar cell is infiltrated with an electrically conducting medium in the pores of the light absorbing layer, in the pores of the first and second conducting layers, and in the pores of the porous substrate. The conducting medium forms a continuous layer inside the pores of the conducting layers, and between the conducting layers inside the pores of the porous insulation substrate thereby enabling transport of electrical charge between the counter electrode and the working electrode including the light absorbing layer. The first conducting layer extracts the electrons from the light absorbing layer and transports the electrons via an external electrical circuit to the counter electrode. The counter electrode is used to transfer the electrons to the conducting medium. The conducting medium transfers electrons back to the light absorbing layer thereby completing the electrical circuit.

Depending on the nature of the conducting medium, either ions or electrons and holes, can be transported between the counter electrode and the working electrode. Electrolytes are used as conducting medium to transport ions between the counter electrode and the light absorbing layer of the working electrode. Examples of electrolytes are liquid electrolytes (such as those based on the I−/I3−, redox couple or cobalt complexes as redox couple), gel electrolytes, dry polymer electrolytes and solid ceramic electrolytes. When ionic charge transporting materials are used as conducting medium, the counter electrode is normally equipped with a catalyst that serves the purpose of facilitating the transfer of electrons to the electrolyte.

The conducting medium exhibits a certain electrical resistance to transport charges. The electrical resistance increases with the charge transport distance. Therefore, when ions are transported between the counter electrode and the light absorbing layer, there will always be a certain electrical resistive loss in the conducting medium. By making the porous substrate thinner, the resistive losses can be reduced. However, when the porous substrate becomes thinner it also becomes more mechanically fragile.

Certain conducting media, such ionic liquid-based electrolytes, can have very low electrical conductivity resulting in very large electrical resistive losses.

Solar cells have been used during a long time for converting the energy of light into electricity. A solar panel contains multiple solar cells connected in series and is used to absorb sunlight as a source of energy to generate electricity. A large number of solar panels are often arranged together in large solar parks for producing electricity to an electricity supply network.

Solar cells are becoming more and more efficient as well as cheaper to produce. So, naturally, companies are making all sorts of consumer products powered at least in part by solar cells. Many portable electronic devices are today provided with built-in rechargeable batteries which store energy, and photovoltaic chargers arranged to supply power to the batteries for charging them. A photovoltaic charger or a solar charger employs solar energy to supply electricity to the devices and to charge batteries. Examples of such portable devices are tablets, mobile phones, head phones and calculators. When solar cells are used, the battery of the device is complemented so that the use time is increased before there is a need to charge the device from an external source. Depending on the efficiency of the photovoltaic charger and the power consumption of the device, the need for charging the device with an external source may even be obsoleted and the device is then only powered by solar power. For example, small calculators are often powered solely by photovoltaic chargers.

Photovoltaic chargers on the market today use various types of solar panels, ranging from thin film panels with efficiencies ranging from 7-15%, to the slightly more efficient monocrystalline panels which offer efficiencies up to 18%. The efficiency is usually tested using Standard Testing Conditions, STC, which is the industry standard for the conditions under which solar panels are tested. In the STC, the irradiation is 1000 $W/m^2$, the temperature is 25° C. and the Air Mass is 1.5. As an example, a solar panel giving an output power of 200 $W/m^2$ has an efficiency of 20%. These conditions simulate what the efficiency of a solar panel is in outside conditions on a summer day with no clouds. The wavelength spectrum of indoor light differs from the wavelength spectrum of outdoor light. For example, wavelengths outside the visible range is often missing in indoor light since glass windows filter UV light and indoor lamps mainly produce light in the visible range. Thus, the efficiency of a solar panel measured in outside conditions cannot be applied to indoor conditions. The typical human eye will respond to wavelengths from about 390 to 700 nm, and indoor light is mostly within the visible spectrum.

In the article "Comparison of the indoor performance of 12 commercial PV products by a simple model" by Georgia Apostolou et al. it is explained how indoor lighting differs from outdoor lighting. The author of the article states that in case of a double-glass insulated window, the decrease in the radiant power at 1 and 5 m from the window will be around 70% and 97%, respectively. The article shows that solar panels today lose a lot of their efficiency in indoor lighting. Hence, a disadvantage with those solar panels is that they have low efficiency at low light intensities.

Other disadvantages with existing solar cell panels for powering electronic devices are that some of them are toxic, have bad mechanical properties and are expensive.

The demands on solar panels for powering consumer products are quite different compared to stationary solar panels used for producing electricity in large solar parks. For example, the solar panel in a consumer product needs to be more robust, flexible, and able to resist impacts. Further, they must be able to produce power at various light conditions, both indoors and outdoors. The light conditions on different parts of the solar panel may also differ due to partial shading of the solar panel, which reduces the efficiency of the solar panel. It is also desired that the solar panels have an aesthetic appeal, since they are visible to the user.

It should be noted that there are many examples of photovoltaic chargers having a solar panel including a plurality of solar cells connected in series for powering portable electronic devices. However, there are several problems with the known solar panels powering the portable electronic devices: They are very sensitive to light intensity and the angle of the incoming light.

A solar panel with solar cells connected in series is sensitive to partial shading because if one solar cell is not producing a current, the whole series of solar cells will stop producing electricity. They are quite sensitive and are easily broken. For example, crystalline silicon solar cells are brittle and may crack when used on a portable electronic device. Furthermore, users may not agree with the aesthetics where large parts of the product are covered by solar panels having a grid of visible current collectors on the upper side. Thus, there is a need to improve the photovoltaic chargers for use with portable electronic devices.

OBJECT AND SUMMARY OF THE INVENTION

One object of the present invention is to provide an improved dye-sensitized solar cell.

The dye-sensitized solar cell unit comprises:
a working electrode comprising a light-absorbing layer,
a porous first conducting layer for extracting photo-generated electrons from the light-absorbing layer, wherein the light-absorbing layer is arranged on top of the first conducting layer,
a porous insulating layer made of an insulating material, wherein the porous first conducting layer is arranged on top of the porous insulating layer,
a counter electrode comprising:
  i. a second conducting layer including conducting material, and
  ii. a porous third conducting layer disposed between the porous insulating layer and the second conducting layer, and in electrical contact with the second conducting layer, and
a liquid electrolyte for transferring electrons from the counter electrode to the working electrode, wherein the second conducting layer is essentially non-catalytic and the third conducting layer comprises catalytic particles for improving the transfer of electrons to the liquid electrolyte.

The second conducting layer is in itself essentially non-catalytic, i.e., only inconsequential catalytic reactions at most may occur in the second conducting layer. The second conducting layer may contain minor amount of catalytic material. However, the catalytic reactions are concentrated to the third conducting layer. The third conducting layer is conducting as well as catalytic. The third conducting layer is in electrical contact with the second conducting layer. The third conducting layer is a part of the counter electrode and provides an extension of the counter electrode.

When the solar cell unit is in use, the second conducting layer receives electrons from an external circuit and distributes the electrons to the third conducting layer. The liquid electrolyte is in pores of the porous third conducting layer. The catalytic particles work as catalysts and facilitates the transfer of the electrons received from the second conducting layer to the liquid electrolyte in the pores of the third conducting layer. The electrons are gained by ions in the electrolyte in the third conducting layer. By locating the catalytic particles as close as possible to the working electrode, the distance the ions in the electrolyte must travel to reach the working electrode is reduced. Accordingly, the power losses in the solar cell unit is reduced, and thus the efficiency of the solar cell unit is increased. The second conducting layer ensures an efficient distribution of electrons to the third conducting layer.

The effective distance between the working electrode and the counter electrode is reduced, and accordingly the resistive losses in the liquid electrolyte is reduced resulting in a higher efficiency of the solar cell. A further advantage achieved with the reduced distance is that it enables the use of conducting media having low electrical conductivity, such as ionic liquid electrolytes.

The catalytic particles are made of a catalytic material, for example, carbon-based materials such as graphene or graphite or carbon black or carbon nanotubes, platina or a combination thereof. The catalytic particles can be electrically conductive as well as catalytic. However, the electrical conductivity of the catalytic particles is lower than the conductivity of the second conducting layer.

The second conducting layer is made of a conducting material. The second conducting layer can be porous or non-porous. The second conducting layer is essentially non-catalytic. Preferably, the second conducting layer excludes catalytic particles. Due to the fact that the second conduction layer is essentially non-catalytic, the electrical conductivity of the second conducting layer can be higher than the electrical conductivity of the third conducting layer. Thus, the combination of a third conducting layer including catalytic particles, and a second conducting layer that is essentially non-catalytic, will result in efficient transfer of electrons from the counter electrode to the electrolyte as well as provide high electrical conductivity of the counter electrode. Further, due to the fact that the second conducting layer is essentially non-catalytic, it is more difficult for the electrons to be transferred to an electrolyte in the second conducting layer. It is preferred that the electrons are transferred to the electrolyte in the third conduction layer due to its shorter distance to the working electrode.

In one aspect, said catalytic particles comprises carbon. Carbon is catalytic material. Carbon is inexpensive and environmentally friendly.

In one aspect, said catalytic particles comprises platinized carbon particles. Platina is a better catalyst than carbon, but it is expensive. By using a combination of platina and carbon, a good catalyst is achieved at a lower cost.

In one aspect, the catalytic particles are substantially evenly distributed in the third conducting layer. The term "substantially evenly distributed" means that the catalytic particles are distributed over the entire area of the third conducting layer. Thus, the catalytic particles are not concentrated to only one or a few parts of the third conducting layer. Although, the concentration of catalytic particles may vary over the area of the third conducting layer, there are no major areas without any catalytic particles. The liquid electrolyte is filled in the pores of the porous third conducting layer. By distributing the catalytic particles substantially evenly in the third conducting layer, transfer of electrons from the third conducting layer to the liquid electrolyte is achieved over the entire area of the third conducting layer.

In one aspect, the third conducting layer comprises a mixture of conducting particles and catalytic particles. The conducting particles are is in electrical contact with the second conducting layer. The catalytic particles are mixed with the conducting particles to improve the transfer of electrons from the conducting particles to the liquid electrolyte. The conducting particles are made of a conducting material. Preferably, the conducting particles are non-catalytic and excludes catalytic material. The mixture of conducting particles and catalytic particles will result in efficient transfer of electrons from the third conducting layer to the electrolyte.

The conducting particles of the third conducting layer include conducting material and is in electrical contact with the second conducting layer. The conducting particles in the third conducting layer provides an extension of the counter electrode. The catalytic particles are distributed among the conducting particles. The conducting particles acts as a glue between the catalytic particle and hold them in place. The conducting particle may form a matrix housing the catalytic particles and keeping them in place.

In one aspect, the catalytic particles are substantially evenly distributed among the conducting particles. By distributing the catalytic particles substantially evenly in the third conducting layer, transfer of electrons from the conducting particles to the liquid electrolyte is improved.

In one aspect, the conducting particles are attached to each other, for example by sintering. The conducting particle may form a matrix housing the catalytic particles. The catalytic particles are embedded in the matrix of conducting particles. For example, the third conducting layer comprises sintered conducting particles, and catalytic particles disposed between the conducting particles. The conducting particles acts as a glue between catalytic particles and keep the catalytic particle in positioned between the conducting particles.

In one aspect, the mixture comprises at least 10% by weight of catalytic particles. Preferably, the mixture comprises at least 20% by weight of catalytic particles.

In one aspect, the mixture comprises at least 20% by weight of conducting particles, preferably at least 30% by weight of conducting particles, and most preferably at least 40% by weight of conducting particles.

The term "NN % by weight" means that the particles represent NN % of the total weight of conducting and catalytic particles. The actual % by weight of catalytic/conducting particles depends on the difference in size between the catalytic and the conducting particles, and on the type of material in the catalytic and conducting particles.

In one aspect, the size of the conducting particles is larger than the size of the catalytic particles. When the catalytic material is more expensive than the conducting material, it is advantageous that the size of the catalytic particles is less than the size of the conducting particles in order to save costs.

In one aspect, at least 80% of the catalytic particles have a diameter less than 50 nm. Such small particles have a large surface/volume ratio and will provide an efficient catalyzation with a reduced volume of catalytic material. If the catalytic material is platina, this will reduce the cost for the catalytic material.

In one aspect, at least 80% of the conducting particles have a diameter larger than 100 nm. Preferably, the size of conducting particles between 0.1-15 µm.

The conducting particles can, for example, be made of metal, metal alloy, metal oxide, or other conducting materials, for example, titanium, titanium alloys, nickel, or nickel alloys, indium or indium oxide.

In one aspect, the conducting particles of the third conducting layer are made of titanium. For example, the third conducting layer comprises sintered titanium particles.

In one aspect, said third conducting layer comprises a mixture of titanium particles and platinized carbon particles. Preferably, the titanium particles are attached to each other, for example, by sintering.

In one aspect, the conducting material of the second conducting layer is titanium.

According to one aspect, the first and second conducting layers comprises titanium or an alloy thereof. It is advantageous to use titanium since it is highly corrosion resistant and can resist high temperatures in air without oxidizing significantly, which is advantageous during production of the solar cell unit.

In one aspect, the thickness of the third conducting layer is less than 100 μm, and preferably less than 20 μm. In one aspect, the thickness of the third conducting layer is at least 1 μm, preferably at least 5 μm and most preferably at least 10 μm.

In one aspect, the thickness of the second conducting layer is at least 1 μm, preferably at least 10 μm and preferably at least 20 μm.

In one aspect, the porous insulating layer comprises a porous substrate made of an insulating material.

In one aspect, the porous third conducting layer comprises a porous substrate made of an insulating material, and the conducting particles of the third conducting layer form a conducting network through the insulating material of the porous substrate. The conducting particles and the catalytic particles are disposed in pores of the porous substrate. The conducting network provides an extension of the counter electrode, which extends into the porous substrate.

With the term "the conducting particles form a conducting network through the insulating material" is meant that the particles form one or more electrically conducting paths through the insulating material of the porous substrate.

In one aspect, the dye-sensitized solar cell unit comprises a porous substrate made of an insulating material, the porous insulating layer is a first part of the porous substrate and the conducting particles of the third conducting layer form a conducting network through a second part of the porous substrate. Due to the conducting network in the porous substrate, the distance between the counter electrode and the light absorbing layer does no longer depend on the thickness of the porous substrate. Thus, the thickness of the insulating layer can be reduced, and by that the distance between the counter electrode and the light absorbing layer can be reduced. Accordingly, the resistive losses in the liquid electrolyte is reduced. Due to the fact that the distance between the counter electrode and the light absorbing layer does no longer depend on the thickness of the porous substrate, it is also possible to use a substrate that is thick enough for safe mechanical handling.

The porous insulating layer prevents short circuit between the first and second conducting layers. The conducting particles in the third conducting layer form a conducting network through the insulating material of the substrate. The conducting network is in electrical contact with the second conducting layer of the counter electrode and will therefore significantly increase the conductive surface area of the counter electrode. The conducting surface area serves the function of transferring electrons from the counter electrode to the conducting medium. The conducting network in the substrate and the thus increased conductive surface area of the counter electrode decrease the charge transfer resistance between the conducting medium and the counter electrode. Additionally, since the third conducting layer forms a conducting network extending through the insulating material of the substrate, the distance between the light absorbing layer and the third conducting layer is shorter than the distance between the light absorbing layer and the second conducting layer. Consequently, since the third and second conducting layers are in electrical contact, the effective distance between the light absorbing layer and the second conducting layer is shorter and the resistive losses in the conducting medium are therefore reduced.

The present invention makes it possible to design the porous insulating layer with an optimal thickness in dependence on demands on resistance and mechanical properties of the insulating layer. An advantage achieved with the present invention is that it is possible to have a thin porous insulating layer disposed between the first and second conducting layer and still use a thick porous substrate having sufficient good mechanical properties for printing the first and second conducting layers. The invention makes it possible to use a thick porous substrate, and still achieve minimum electrical resistive losses in the conducting medium.

In one aspect, the first conducting layer comprises porous titanium, and a titanium oxide layer is formed on the surfaces of the porous titanium. For example, the first conducting layer comprises sintered titanium particles, and the surfaces of the sintered titanium particles are covered by a titanium oxide layer. The titanium oxide layer prevents electrons from leaking from the porous titanium in the first conducting layer to the liquid electrolyte, and accordingly increases the efficiency of the solar cell unit.

In particular, the combination of the titanium oxide layer that prevents electrons from leaking from the first conducting layer to the liquid electrolyte, and a counter electrode comprising a conducting layer with a mixture of conducting particles and catalytic particles, and a conducting layer without catalytic particles, which improves the efficiency of the counter electrode, will result in efficient solar cell unit which is capable of producing power in a wide range of different light conditions. The solar cell unit works during poor as well as excellent lighting conditions, for example, indoors in artificial light, and outdoors in the shadow and when exposed to strong sunlight.

In one aspect, the thickness of said titanium oxide layer is larger than 5 nm, preferably larger than 10 nm, and more preferably larger than 20 nm.

In one aspect, the thickness of said titanium oxide layer is between 10 and 200 nm, and preferably between 20-50 nm.

According to one aspect, the conducting medium is an ionic based electrolyte. An advantage with using an ionic based electrolyte is that it can render high long-term stability to the solar cell performance. Another advantage is that the efficiency of the solar cell unit is stable or increases with increasing temperature. Accordingly, the solar cell unit operates well in a wide range of temperatures.

In one aspect, the electrolyte is any of a liquid iodide/triiodide electrolyte, a liquid copper complex, or a liquid cobalt complex-based electrolyte, or a combination thereof.

In one aspect, the conducting medium comprises iodide ($I^-$) and triiodide ($I_3^-$) and the content of triiodide in the conducting medium is between 1 mM and 20 mM. This embodiment makes it possible to achieve high power generation at low light intensities.

According to one aspect, the porous substrate is a sheet comprising woven microfibers extending through the entire solar cell unit. For example, the woven microfibers are made of glass fibers. The sheet comprising woven microfibers extending through the entire solar cell unit contributes to provide a flexible, twistable, and impact resistant photovoltaic charger.

In one aspect, the solar cell unit produces at least 5 μW/cm$^2$ when the light intensity received by the light-absorbing layer is 200 Lux, and at least 600 μW/cm$^2$ when the light intensity received by the light-absorbing layer is 20

000 Lux. The solar cell unit produces more than 5 µW/cm² measured on active solar cell area, when the light intensity received by the light-absorbing layer is 200 Lux. It has been proven through tests that the solar cell unit according to the invention is capable of producing more than 5 µW/cm² when the light intensity received by the light-absorbing layer is 200 Lux. Lux is a suitable unit for measuring light intensity since it measures the intensity of light perceived by the human eyes. Lux is commonly used to measure the intensity of indoor light, which is mostly within the part of electromagnetic spectrum that is visible to the human eye. Accordingly, it is suitable to relate the efficiency of the solar cell unit to the light intensity measured in Lux.

According to one aspect, the solar cell unit produces more than 5.5 µW/cm² when the light intensity received by the light-absorbing layer is 200 Lux. It has been proven through tests that the solar cell unit according to the invention is capable to produce more than 5.5 µW/cm² when the light intensity received by the light-absorbing layer is 200 Lux.

According to one aspect, the solar cell unit produces at least 150 µW/cm² when the light intensity received by the light-absorbing layer is 5 000 Lux.

According to one aspect, the solar cell unit produces at least 600 µW/cm², and preferably at least 700 µW/cm² when the light intensity received by the light-absorbing layer is 20 000 Lux. More particularly, the solar cell unit is capable of producing at least between 5 and 600 µW/cm² when the light intensity received by the light-absorbing layer is between 200 and 20 000 Lux. The power produced by the solar cell unit increases substantially linearly when the light intensity received by the light-absorbing layer increases from 200 to 20 000 Lux. Thus, the solar cell unit is capable of producing power in a wide range of different light conditions. The solar cell unit works during poor as well as excellent lighting conditions, for example, indoors in artificial light, outdoors in the shadow and when exposed to strong sunlight.

With substantially linear is meant that the power produced increases linearly with increasing light intensity at least in a main part of the interval 200 and 20 000 Lux. For example, the power produced may differ slightly from linear with intensities between 200 and 1000 Lux.

According to one aspect, the solar cell unit generates a voltage varying less than 40%, when the light intensity received by the light-absorbing layer varies between 200 and 50 000 Lux. For example, the solar cell unit generates a voltage varying less than 0.4 V, and preferably less than 0.3 V, when the light intensity received by the light-absorbing layer varies between 200 and 50 000 Lux. The voltage generated by the solar cell unit is quite even in the interval 200 to 50 000 Lux. This means that the produced voltage is fairly independent of the light intensity. Due to the fact that the voltage output from the solar cell unit only varies a little when the light intensity received by the light-absorbing layer varies between 200 and 50 000 Lux, it is possible to use a boost converter to step up the voltage for a wide range of different light intensities without extensive loss during the conversion.

According to one aspect, the electrolyte comprises ions, for example copper ions, or iodide and triiodide ions. The level of the generated voltage depends on the ions in the electrolyte. For example, if the electrolyte contains copper ions, the solar cell unit can generate a voltage of about 1 V in an open circuit when the light intensity received by the light-absorbing layer is 20 000 Lux, and if the electrolyte contains iodide and triiodide ions, the solar cell unit can generate a voltage of 0.65 V in an open circuit when the light intensity received by the light-absorbing layer is 20 000 Lux.

According to one aspect, the solar cell unit generates a voltage of at least 0.3 V in an open circuit when the light intensity received by the light-absorbing layer is 200 Lux.

Further, the solar cell unit generates a voltage less than 1.2 V in an open circuit when the light intensity received by the light-absorbing layer is 20 000 Lux.

According to one aspect, the current produced by the solar cell unit increases linearly when the light intensity received by the light-absorbing layer increases from 200 to 20 000 Lux.

According to one aspect, the solar cell unit produces a current of at least 15 µA/cm² when the light intensity received by the light-absorbing layer is 200 Lux, and the current produced by the solar cell unit is linearly increasing when the light intensity received by the light-absorbing layer increases from 200 to 20 000 Lux. Due to the linearity, and the fact that the solar cell unit does not produce any current when the light intensity is zero and produces a current of at least 15 µA/cm² when the light intensity is 200 Lux, the solar cell unit produces a current of about 1500 µA/cm² when the light intensity received by the light-absorbing layer is 20 000 Lux. Thus, the solar cell unit is capable of producing sufficient power to charge batteries of electronic devices in a wide range of light intensities.

Another object of the present invention is to provide a photovoltaic charger specially adapted for charging an electronic device.

This object is achieved by a photovoltaic charger comprising a dye-sensitized solar cell unit according to the invention, an encapsulation encapsulating the solar cell unit, a first conductor electrically connected to the first conducting layer, and at least one second conductor electrically connected to the second conducting layer, wherein the photovoltaic charger contains only one single solar cell unit and a boost converter electrically connected to the first and second conductors, and the boost converter is adapted to step up the voltage from the solar cell unit while stepping down the current from the solar cell unit.

The photovoltaic charger according to the invention is capable of charging devices when the light conditions are very poor. For example, the photovoltaic charger is capable of charging the electronic devices when the only light source is a lamp. This makes it possible to charge electronic devices indoors at night.

Furthermore, since the photovoltaic charger has only one single solar cell unit, there will be no problems from partial shading. Even if parts of the surface of the solar cell unit are shaded, the non-shaded parts will still produce a current. Thus, the photovoltaic charger according to the invention is still capable of charging the electronic device even when the active area of the photovoltaic charger is partially shaded. With active area is meant the area of the solar cell unit, which contributes to produce power when it is exposed to light.

The first conductor works as a current collector and collects currents from the first conducting layer. The second conductor works as a current distributor and distributes currents to the second conducting layer. The photovoltaic charger has one single scalable solar cell which can be adapted to any shape or size of a portable electronic device. There is no need for a plurality of current collectors arranged across the visible side of the photovoltaic charger, and the absence of visible current collectors result in a visually homogenous surface. Thus, the photovoltaic charger can be used on the portable electronic device without affecting the design of the device. In other words, a portable electronic device can be powered by the photovoltaic charger without it being visible to the onlooker. Another advantage with not having many connection elements arranged over the surface of the solar cell unit is that more area of the solar cell unit can be used for generating power since there are not a plurality of current collectors blocking the incoming light.

Further advantages with the photovoltaic charger include low costs, impact resistance, flexibility, and independence of the angle of the incoming light.

Further, the size of the single solar cell unit is scalable, and accordingly the size and power of the photovoltaic charger can be adapted to the size and power demand of different devices to be charged. By increasing the area of the solar cell unit, the power generated by the photovoltaic charger is increased.

According to an aspect, the porous light-absorbing layer includes dyed $TiO_2$. A porous light-absorbing layer including dyed $TiO_2$ is non-brittle and is not dependent on the angle of the incoming light.

The photovoltaic charger comprises a boost converter electrically connected to the first and second conductors and the boost converter is adapted to step up the voltage from the solar cell unit while stepping down the current from the solar cell unit. Thus, the photovoltaic charger is capable to generate a sufficient voltage level for charging electronic devices in a wide range of different light conditions. Different types of batteries require different voltage levels. The boost converter makes it possible to provide rechargeable batteries of electronic devices with the voltage level needed by the type of battery. The voltage produced by the single solar cell unit is too low to charge certain types or batteries, for example, lithium batteries that require about 3.6 V. In the prior art, the required voltage is achieved by arranging a plurality of solar cell units connected in series. According to the invention, the required voltage is achieved by connecting a boost converter to the single solar cell unit. Thus, it is possible to provide a photovoltaic charger having only one solar cell unit capable to charge batteries that require different voltage levels.

In one aspect, the boost converter is configured to convert the voltage from the solar cell unit to a voltage that lies between 1 and 10 V. Thus, the photovoltaic charger is capable of charging batteries used for many types of electronic devices for consumer applications, such as lithium or nickel-based batteries.

In one aspect, the boost converter is configured to convert a voltage between 0.25 and 1 V to a voltage above 3 V, and preferably above 3.5 V. Thus, the photovoltaic charger can be used to charge a battery having a load voltage above 3 V, such as a lithium battery that typically requires a load voltage between 3 and 4.5 V depending on how loaded the battery is.

According to one aspect, the boost converter is capable to handle currents between 15 and 9000 $mA/cm^2$. Thus, the boost converter is capable to handle currents from the solar cell unit from 200 lux to 120 000 lux, which is full sun light.

The size of the conducting particles in the third conducting layer is smaller than the size of the pores of the porous substrate, and the conducting particles are accommodated in the pores of the porous substrate.

Preferably, the porous insulating layer is thinner than the third conducting layer.

In one aspect, the porous substrate extending from the second conducting layer to the porous insulating layer comprises infiltrated conducting particles. The porous insulating layer extends from the porous substrate to the first conducting layer and may be formed as an integral part of the porous substrate or be a separate layer on the porous substrate.

The liquid electrolyte for transferring charges is disposed within the pores of the porous materials of the light absorbing layer, the first conducting layer, the porous insulation layer and the porous substrate.

The solar cell is preferably a monolithic dye-sensitized solar cell. A monolithic dye-sensitized solar cell is characterized in that all layers are directly or indirectly deposited on one and the same porous substrate.

The first and second conducting layers are positioned on a shadow side of the light absorbing layer, i.e. the side opposite the side receiving the light. Thus, the first and second conducting layers are positioned on the same side of the light absorbing layer.

According to an aspect, the porous insulation substrate comprises woven microfibers. Woven microfibers are mechanically strong. Preferably, the woven microfibers are ceramic microfibers, such as glass fibers. A microfiber is a fiber having a diameter less than 10 µm and a length larger than 1 nm. Ceramic microfibers are fibers made of a refractory and inert material, such as glass, $SiO_2$, $Al_2O_3$ or aluminosilicate. The porous substrate may further comprise non-woven microfibers. The non-woven microfibers can, for example, be organic microfibers. Organic microfibers are fibres made of organic materials such as polymers such as, e.g., polycaprolactone, PET, PEO etc, or cellulose such as, e.g., nanocellulose (MFC) or wood pulp. The non-woven microfibers can also be inorganic such as, glass, $SiO_2$, $Al_2O_3$ or aluminosilicate.

According to an aspect, the thickness of the third conducting layer is less than 1 mm, and preferably less than 100 µm. Due to the fact that the third conducting layer is very thin, the demand on the conductivity of the third conducting layer is rather low, and lower than the demand on the conductivity of the first and second layers. Thus, the network of conducting particles achieves a sufficient conductivity.

According to an aspect, the thickness of the porous insulating layer is between 0.1 µm and 20 µm, and preferably between 0.5 µm and 10 µm. Thus, the electrical resistive losses in the conducting medium are reduced and still short circuit is avoided between the first and third conducting layer.

The thickness of the first conducting layer is advantageously also kept thin in order to have a short distance between the light absorbing layer and the third conducting layer and the counter electrode. The thickness of the first conducting layer can be between 0.1 and 40 µm, and preferably between 0.3 and 20 µm.

According to one aspect, the conducting particles in the porous third conducting layer are made of the same material as is used in the second conducting layer.

According to one aspect, the porous insulating layer is a part of the porous substrate. The solar cell comprises a porous substrate made of an insulating material and comprising a first portion including said conducting particles and a second portion without any conducting particles, and the first portion forms said third conducting layer and the second portion forms said porous insulating layer. The second portion of the porous substrate may be thinner than the first portion of the porous substrate. In this embodiment, the third conducting layer and the porous insulating layer are different parts of the same porous substrate. Thus, the porous insulating layer can be formed as an integral part of the porous substrate or be a separate layer on the porous substrate. The portion of the substrate comprising conducting particles extends from the second conducting layer towards the first conducting layer and ends at a distance from the top side of the substrate, to form the porous insulating layer. An advantage with this embodiment is that it is easy to manufacture.

According to an aspect, the porous insulating layer is disposed on one side of the porous substrate, and the second conducting layer is disposed on the opposite side of the porous substrate. For example, the porous insulating layer is printed on the porous insulation substrate. In this aspect, the porous insulating layer is formed as a separate layer on the porous substrate.

According to an aspect, the solar cell is characterised in that it comprises a porous substrate extending from the second conducting layer to a porous insulating layer and comprises conductive particles forming a conducting network in electrical contact with the second conducting layer.

According to an embodiment of the invention, the porous substrate and the porous insulating layer are formed as integral layers of an insulating material.

According to an aspect, the porous insulating layer is a separate layer disposed on the porous substrate and both the porous insulating layer and the porous substrate are made of an insulating material.

According to an aspect, the light absorbing layer is a porous TiO2 nanoparticle layer with adsorbed organic dye. Examples of organic dyes are: N719, N907, B11, C101. Also other organic dyes can be used.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 1:
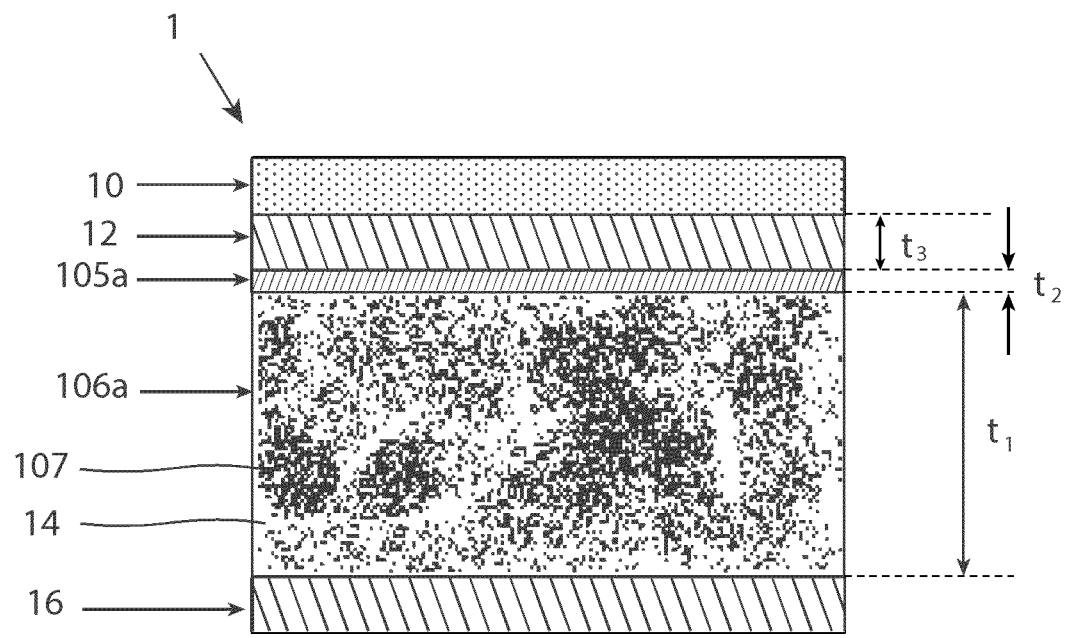
FIG. 1 shows a first example of a dye-sensitized solar cell.

FIG. 1 shows a first example of a dye-sensitized solar cell 1. The dye-sensitized solar cell comprises a working electrode in the form of a light absorbing layer 10, a first conducting layer 12 for extracting photo-generated electrons from the light absorbing layer 10, a counter electrode including a second conducting layer 16, a porous insulating layer 105a arranged between the first and second conducting layers, and a conducting medium (not shown) for transferring charges between the counter electrode and the working electrode. The dye-sensitized solar cell further comprises a third conducting layer 106a disposed between the porous insulating layer 105a and the second conducting layer 16 and in electrical contact with the second conducting layer 16.

The third conducting layer 106a includes a porous substrate 14 made of an insulating material and conducting particles 107 forming a conducting network through the porous substrate 14.

The conducting particles are disposed in pores of the porous substrate 14. The porous insulating layer 105a is suitably formed by printing a layer of insulating material on a top side of the porous substrate 14. The insulating material is, for example, an inorganic material that is positioned between the first and third conducting layers and insulates the first and third conducting layers from each other and creates a porous insulating layer between the first and third conducting layer after heat treatment. The porous substrate 14 extends from the second conducting layer 16 to the porous insulating layer 105a. In this embodiment, the porous insulation layer 105a is a separate layer disposed on one side of the porous substrate 14. The first conducting layer 12 is, for example, formed by printing conducting particles on the porous insulating layer 105a. Suitably, all of the layers 1, 2, 3 and 105a are formed by printing. The porous insulating layer 105a is, for example, made of ceramic microfibers, or materials derived by delaminating layered crystals such 2D materials or nanosheets.

Figure 2:
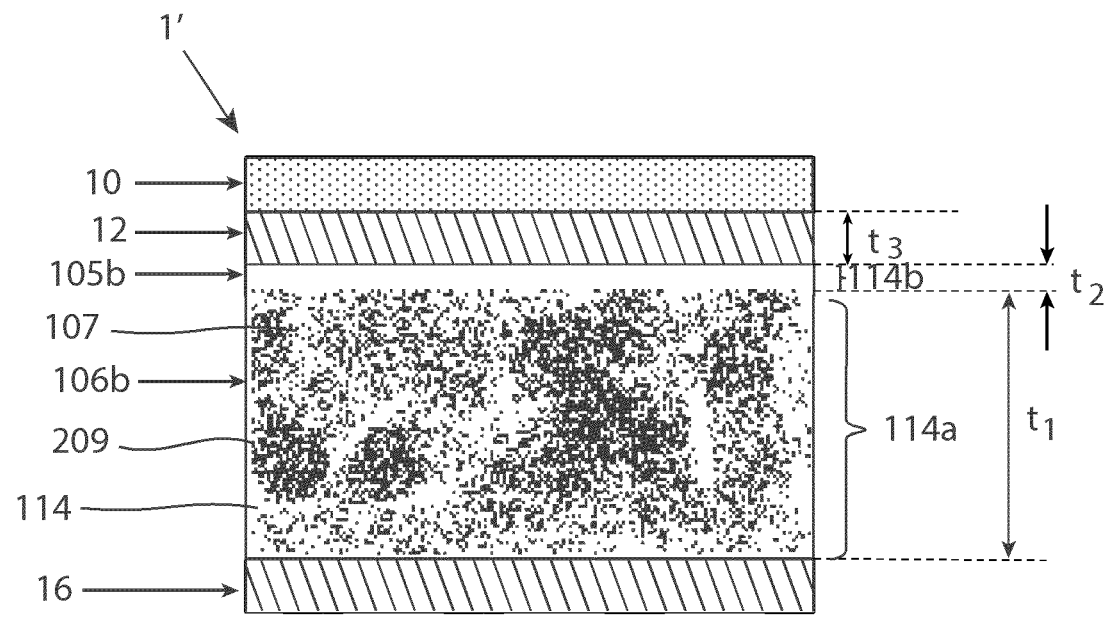
FIG. 2 shows a second example of a dye-sensitized solar cell.

FIG. 2 shows a second example of a dye-sensitized solar cell 1'. The dye-sensitized solar cell comprises a working electrode in the form of a light absorbing layer 10, a first conducting layer 12, a counter electrode including a second conducting layer 16, and porous substrate 114 made of an insulating material. The porous substrate 8 comprises a first portion 114a including conducting particles 107 forming a conducting network in the insulating material of the porous substrate, and a second portion 114b without any conducting particles and forming a porous insulating layer 105b. Thus, the first portion 114a forms a third conducting layer 106b, and the second portion 114b forms a porous insulating layer 105b. In this embodiment, the porous insulating layer 105b is formed as an integral part of the porous substrate 114.

The conducting layers 12, 16, 106a, 106b are porous to allow a conducting medium to penetrate through the conducting layers. Suitably, the conducting medium is a solid-state hole conductor, or an ionic liquid-based electrolyte or a cobalt complex based electrolyte.

However, the conducting medium can be any suitable conducting medium. The conducting medium can be a liquid, a gel, or a solid material such as a semiconductor. Examples of electrolytes are liquid electrolytes (such as those based on the I−/I3−, redox couple or cobalt complexes as redox couple), gel electrolytes, dry polymer electrolytes and solid ceramic electrolytes. Examples of semiconductors are inorganic semiconductors, such as CuSCN or CuI, and organic semiconductors, such as, e.g., Spiro-OMeTAD.

The porous substrate 14, 114 is, for example, made of microfibers. A microfiber is a fibre having a diameter less than 10 μm and length larger than 1 nm. Suitably, the porous substrate comprises woven microfibers. Ceramic microfibers are fibres made of a refractory and inert material, such as glass, SiO2, Al2O3 and aluminosilicate. Organic microfibers are fibres made of organic materials such as polymers such as, e.g., polycaprolactone, PET, PEO etc, or cellulose such as, e.g., nanocellulose (MFC) or wood pulp. The porous substrate 14, 114 may comprise woven microfibers and non-woven microfibers disposed on the woven microfibers. The thickness of the porous substrate 14, 114 is suitably between 10 μm and 1 mm. Such a layer provides the required mechanical strength.

The porous substrate 14, 114 is infiltrated by conducting particles 107 so that a conducting network is formed through the insulating material and by that the third conducting layer 106a, 106b is achieved. The network of electrical particles in the third conducting layer is in electrical contact with the second conducting layer 16. The porous insulating layer 105a, 105b prevents short circuit between the first and second conducting layers. The conducting particles must be smaller than the pore size of the substrate 14,114 in order to be infiltrated effectively. The conducting particles 107 form a conducting network 209 through the insulating material of the substrate. The conducting network 209 is in direct physical and electrical contact with the second conducting layer 16 of the counter electrode. The conducting particles serve the function of transferring electrons from the counter electrode to the conducting medium. The resistive losses in the conducting medium are reduced due to the conducting network in the substrate. Thus, it possible to use a thick porous substrate, and still achieve minimum electrical resistive losses in the conducting medium.

Since the network of conducting particles is in direct physical and electrical contact with the counter electrode and in the same time are infiltrated a certain distance into the substrate, it is possible for the counter electrode to transfer electrons via the conducting particles to the conducting medium effectively closer to the light absorbing layer resulting in a smaller effective distance between the counter electrode and the light absorbing layer. Therefore, the electrical losses in the conducting medium can be reduced by infiltrating conducting particles into the substrate. In the case of using a semiconductor with low electronic conductivity as a conducting medium, it is necessary to infiltrate the semiconductor through the light absorbing layer and through the current collecting layer and into the porous substrate deep enough such that the semiconductor is brought into direct physical and electrical contact with the infiltrated conducting particles.

Preferably, the thickness t1 of the third conducting layer 106a, 106b is less than 1 mm, and most preferably less than 100 μm. In this example, the porous substrate 14 has been infiltrated with conducting particles from a bottom side. The conducting particles can also be catalytic. The conducting particles can be made of metal, metal alloy, metal oxide, or other conducting materials, for example, titanium, titanium alloys, nickel, nickel alloys, carbon-based materials, conducting oxides, conducting nitrides, conducting carbides, conducting silicides, or mixtures thereof.

Electrical contact between the first and second conducting layers is prevented by the porous insulating layer 105a,105b.

For example, the thickness t2 of the porous insulating layer is between 0.1 μm and 20 μm, and preferably between 0.5 μm and 10 μm.

The conducting layers 2, 3, 106a, 106b are porous to allow the conducting medium to penetrate through the conducting layers. The material forming the conducting layer 2, 3 must have a suitable corrosion resistance as to withstand the environment in the solar cell, and preferably also be resistant to temperatures above 500° C. in air without losing adequate conductivity. Preferably, the conducting layers 2, 3 are made of a material selected from a group consisting of titanium, titanium alloys, nickel, nickel alloys, graphite, and amorphous carbon, or mixtures thereof. Most preferably, the conducting layers 2, 3 are made of titanium or a titanium alloy or mixtures thereof.

Preferably, the thickness t3 of the first conducting layer 12 is between 0.1 and 40 μm, or preferably between 0.3 and 20 μm.

The light absorbing layer 10 of the working electrode may include a porous TiO2 electrode layer deposited onto the first conducting layer 12. The TiO2 electrode layer may comprise TiO2 particles dyed by adsorbing dye molecules on the surface of the TiO2 particles. Alternatively, the first conductive layer has a surface layer of TiO2 and the light absorbing layer is a perovskite layer. The porosity of the porous substrate will enable charge transport through the substrate.

In the following, an example of a method for manufacturing the first example of a solar cell according to the invention is described.

A porous substrate 14 made of an insulating material is infiltrated with conducting particles having a size smaller than the pore size of the substrate to form a third conducting layer. The substrate is infiltrated so that a network of conduction particles is formed through the entire substrate. A layer of insulating material is deposited on one side of the porous substrate to form a porous insulating layer. The insulating material is, for example, microfibers made of a ceramic or organic material. An ink comprising conductive particles are deposited on the porous insulating layer to form the first conducting layer, and an ink comprising conductive particles are deposited on an opposite side of the porous substrate to form the second conducting layer. The porous insulating layer is, for example, deposited on the porous substrate by screen printing, slot die coating, spraying, or wet laying. The porous first and second conducting layers are, for example, deposited on the porous substrate by screen printing or any other suitable printing technique.

In the following an example of a method for manufacturing the second example of a solar cell 1' according to the invention is described.

Step 1: A blocking agent is deposited on a top side of a substrate 114 made of an insulating material, to form a blocking layer in a second portion 114b of the substrate 114. The blocking layer is deposited in order to physically prevent the conducting particles from being infiltrated all the way to other side of the substrate. Therefore, the blocking layer prevents direct physical and electrical contact between the first conducting layer and the conducting particles. The blocking layer may consist of polymers, ceramic particles, polymer fibres, glass fibers, carbon nanotubes (CNT), nanocellulose or microfibrillated cellulose (MFC). It is advantageous to use fibers as a blocking agent in the blocking layer. It is advantageous to use fibers with very small diameter.

Step 2: The porous substrate 114 is infiltrated from a bottom side of the substrate with conducting particles having a size smaller than the pore size of the substrate to form a third conducting layer 106b in a first portion 114a of the substrate. The conducting particles may consist of the same material as is used in the second conducting layer. It is also possible to use other types of particles such as carbon-based materials (graphite, carbon black, CNT, graphene, etc). It is also possible to use other types of particles such as conducting oxides (ITO, FTO, ATO etc) or carbides, nitrides or silicides.

Step 3: An ink comprising conductive particles is printed on the top side of the porous substrate 114 to form the first conducting layer 12.

Step 4: An ink comprising conductive particles is printed on the bottom side of the porous substrate 14 to form the second conducting layer 16.

Step 5: A TiO2 electrode layer is deposited onto the first conducting layer 12 to form the working electrode 1.

Step 6: The substrate is heat treated to burn off the blocking layer thus forming the porous insulating layer 105b.

In the following a more detailed example of a method for manufacturing a solar cell according to the invention will be described.

EXAMPLE

Liquid Redox Electrolyte-Based Dye-Sensitized Solar Cell (DSC)

In the first step a 28 μm thin glass fabric (MS1037, Asahi Kasei E-materials), was wet laid with a glass microfiber stock solution containing C-glass microfiber, fiber diameter: 0.5 μm) and water based colloidal silica.). The wet laid glass fabric was then dried at 110° C. 5 min in air in a belt oven.

Subsequently in a second step the glass microfiber deposited glass fabric was then wet laid with a solution containing dispersed glass microfibers and nanocellulose on the other side in order to create a blocking layer: The nanocellulose which was added to the second glass fiber stock serves the function of creating a blocking layer that prevents conducting particles from passing through the blocking layer. The blocking effect can be enhanced by increasing the amount of added nanocellulose to the glass fiber stock. Thus, infiltrated particles in the third conducting layer can therefore be blocked by the blocking layer.

A variation of the second step is to omit adding glass microfiber to the solution that contains nanocellulose and is used to create the blocking layer. Another variation of the second step is to print or spray a solution of nanocellulose onto one of the sides of the dried glass microfiber treated glass fabric in order to create a blocking layer. Another variation of the second step is to use dispersed carbon nanotubes or a dispersed 2D material instead of nanocellulose in order to create a blocking layer.

Subsequently in a third step, an ink containing platinized FTO particles was prepared by first mixing FTO particles of 80 nm diameter with an isopropanol solution of hexachloroplatinic acid and then drying the mixture at 60 C for 30 min and then heating the treated powder in air to 400 C for 15 min. After the heat treatment the platinized FTO powder was grinded together with terpineol in a ball mill to create the final ink containing platinized FTO particles in terpineol. In the next step the double sided deposited glass fabric with a blocking layer was infiltrated with conducting catalytic particles by printing, for example, screen printing, the ink containing platinized FTO particles on the non-woven glass microfiber side opposite to the blocking layer side. The printed ink was then allowed to dry in air at 120 C for 10 min.

A variation of the third step is to use other types of platinized conducting particles instead of FTO, such as, e.g., ATO, ITO, graphite, carbon black, graphene, or carbon nanotubes. Another variation of the third step is to use particles that are both conducting and catalytic such as metal carbides, metal nitrides and metal silicides.

Subsequently in a fourth step an ink was prepared by mixing TiH2 with terpineol using 50:50 ratio by weight. The ink was then bead milled for 25 minutes at 5000 RPM using 0.3 mm zirconia beads. The zirconia beads were then separated from the ink by filtration. The filtered ink was then printed onto the double sided deposited glass fabric having a blocking layer and layer of infiltrated platinized FTO particles and then dried at 200° C. for 5 minutes. Subsequently the filtered ink was printed onto the other side of the glass fabric and then dried at 200° C. for 5 minutes. Subsequently the deposited glass fabric was vacuum sintered at 600° C. The pressure during sintering was lower than 0.0001 mbar. Consequently, a first conducting layer and a second conducting layer and a third conducting layer was formed after the vacuum heating process.

Subsequently in a fifth step a TiO2 based ink (Dyesol 18NR-T) was screen printed on top of the first conducting layer and then dried at 120 C for 10 min.

Subsequently in a sixth step the treated glass fabric was heated in air to 500 C for 20 minutes. Consequently, the deposited TiO2 layer was sintered and the nanocellulose based blocking layer was removed by combustion.

Subsequently in a seventh step the treated glass fabric was immersed in a solution of 1 mM Z907 dye in methoxypropanol and heat treated at 70° C. for 120 minutes and then rinsed in methoxy propanol and dried. Consequently, the sintered TiO2 film was dye-sensitized.

Subsequently in an eighth step an iodide/triiodide (I−/I3)- based redox electrolyte containing polymer was deposited on top of the TiO2 layer in the form of a gel.

Subsequently in a ninth step the cell was sealed by infiltrating a polymer at the edges around the DSC and covering the both sides with glass in the same time allowing for external electrical connection to the first and second conducting layer.

The porous insulating layer can be deposited on the porous substrate by any of screen printing, slot die coating, spraying, or wet laying.

Figure 3A:
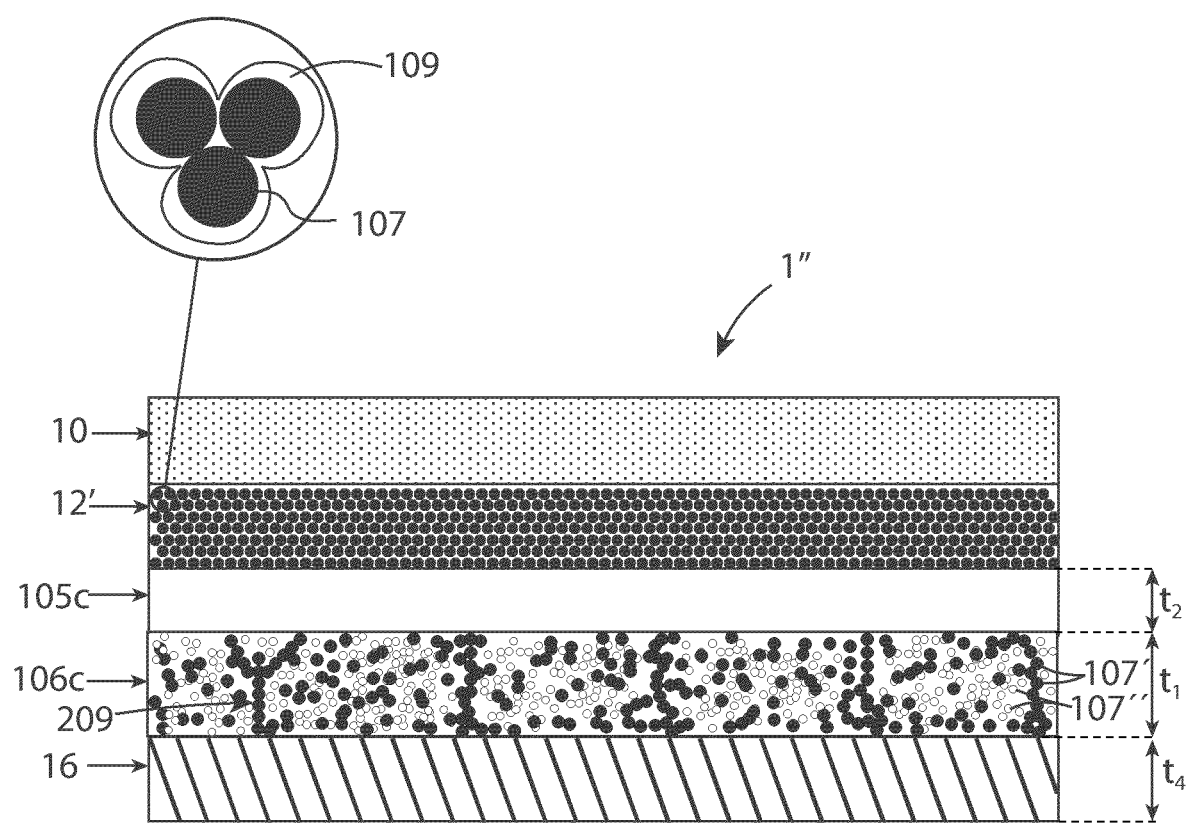
FIG. 3a shows a third example of a dye-sensitized solar cell.

FIG. 3a shows another example of a dye-sensitized solar cell unit 1″. The solar cell unit 1″ comprises a working electrode comprising a light-absorbing layer 10 and a porous first conducting layer 12' for extracting photo-generated electrons from the light-absorbing layer, wherein the light-absorbing layer 10 is arranged on top of the first conducting layer 12'. The solar cell unit 1″ further comprises a porous insulating layer 105c made of an insulating material, wherein the first conducting layer 12' is arranged on top of the porous insulating layer 105c. The solar cell unit 1″ has a counter electrode comprising a second conducting layer 16 including a conducting material and a porous third conducting layer 106c comprising a mixture of conducting particles 107' and catalytic particles 107″. The second conducting layer 16 is essentially non-catalytic. The porous third conducting layer 106c is disposed between the porous insulating layer 105c and the second conducting layer 16, and the third conducting layer 106c is in electrical contact with the second conducting layer 16. In one aspect, the second conducting layer is also porous. The solar cell unit 1″ also comprises a liquid electrolyte (not shown) for transferring charges between the counter electrode and the working electrode. The liquid electrolyte is located in the pores of the porous layers, such as the porous first and third conducting layers, and the porous insulating layer.

The conducting particles in the third porous layer is a part of the counter electrode. The conducting particles 107' in the third porous conducting layer provides an extension of the counter electrode. Consequently, since the third and second conducting layers 106c, 16 are in electrical contact, the effective distance between the light absorbing layer 10 and the second conducting layer 16 is shorter and the resistive losses in the conducting medium are therefore reduced. Further, the catalytic particles 107" facilitating the transfer of electrons from the conducting particles 107' in the third porous conducting layer to the liquid electrolyte.

The conducting particles can, for example, be made of metal, metal alloy, metal oxide, or other conducting materials, for example, titanium, titanium alloys, nickel, or nickel alloys. The catalytic particles are, for example, made of carbon-based materials such as graphene or graphite or carbon black or carbon nanotubes, platina or a combination thereof.

Suitably, the first and second conducting layers comprises titanium or an alloy thereof. For example, the conducting material of the second conducting layer is titanium, and the conducting particles of the third conducting layer 106c are made of titanium. For example, the first and second conducting layers may comprise sintered titanium particles. It is advantageous to use titanium since it is highly corrosion resistant and can resist high temperatures in air without oxidizing significantly, which is advantageous during production of the solar cell unit.

Preferably, the catalytic particles comprise carbon particles. Carbon is inexpensive and environmentally friendly. More preferably, the catalytic particles include platinized carbon particles. Platina is a better catalyst than carbon, but it is expensive. By using a combination of platina and carbon, a good catalyst is achieved at a lower cost. The catalytic particles can be electrically conductive as well as catalytic. For example, carbon is electrically conductive as well as catalytic. However, carbon is a poor conductor in comparison to other conducting material, such as titanium.

In one aspect, the third conducting layer 106c comprises a mixture of titanium particles and platinized carbon particles, and the conducting material of the second conducting layer is titanium. Preferably, the size of the particles is less than the size of the pores in the porous substrate to be able to be infiltrated into the substrate during production of the solar cell.

In one aspect, the second conducting layer 16 comprises porous titanium, for example sintered titanium particles.

The electrical conductivity of the first and second conducting layer 12', 16 is higher than the electrical conductivity of the third conducting layer 106c. The combination of a conducting layer 106c with a mixture of conducting particles and catalytic particles, and a conducting layer 16 without catalytic particles will result in efficient transfer of electrons from the conducting particles 107' of the counter electrode to the electrolyte as well as high electrical conductivity of the counter electrode.

In one aspect, the thickness t1 of the third conducting layer 106c is at least 1 µm, preferably at least 5 µm and most preferably at least 10 µm. In one aspect, the thickness t1 of the third conducting layer 106c is less than 100 µm, and preferably less than 20 µm.

In one aspect, the thickness t2 of the porous insulating layer is between 0.1 µm and 20 µm, and preferably between 0.5 µm and 10 µm.

In one aspect, the thickness t4 of the second conducting layer 16 is at least 1 µm, preferably at least 10 µm and preferably at least 20 µm.

The solar cell unit 1" may comprise a porous substrate 14, 114 in the same way as described with reference to FIGS. 1 and 2. The porous insulating layer 105c may comprise the whole substrate 14 as shown in FIG. 1, or only a part 114a of the porous substrate 114 as shown in FIG. 2. According to one aspect, the porous substrate is a sheet comprising woven microfibers extending through the entire solar cell unit. For example, the woven microfibers are made of glass fibers.

Figure 3B:
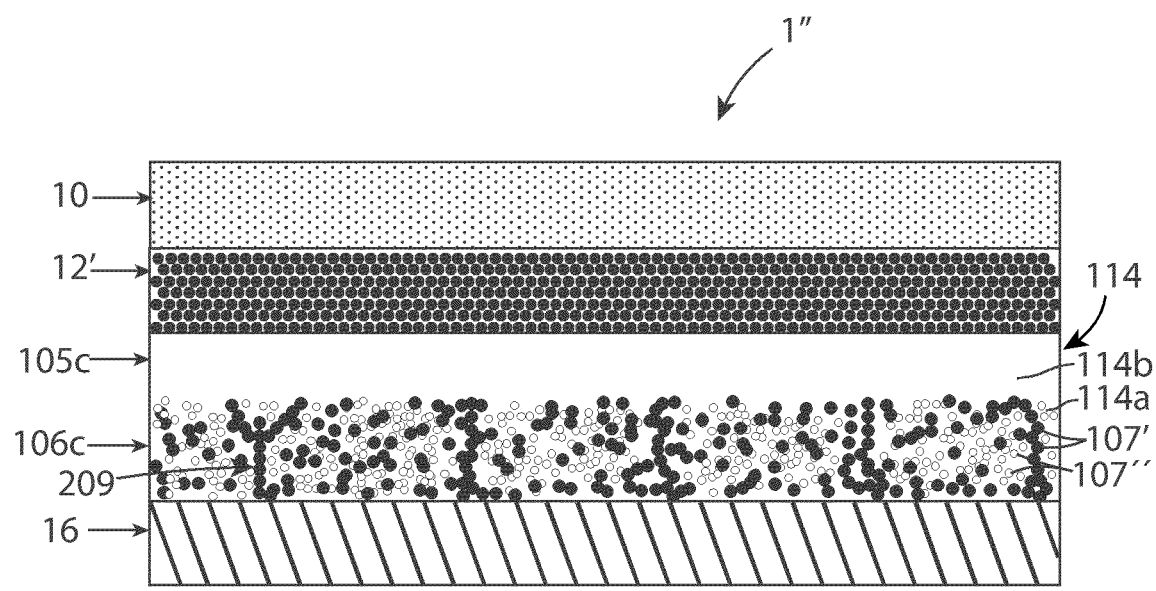
FIG. 3b shows a fourth example of a dye-sensitized solar cell.

FIG. 3b shows an example of a dye-sensitized solar cell 1" comprising a porous substrate 114 made of an insulating material. The porous third conducting layer 106c comprises a first part 114a of the porous substrate 114, and the porous insulating layer 105c comprises a second part 114b of the porous substrate 114. The conducting particles 107' of the third conducting layer 106c form a conducting network 209 through the insulating material of the part 114a of the porous substrate 114. The conducting network 209 form one or more electrically conducting paths through the insulating material of the first part 114a of porous substrate. The conducting particles 107' and the catalytic particles 107" are disposed in pores of the porous substrate 114. The conducting network 209 provides an extension of the second conducting layer, which extends into the porous substrate 114. Due to the conducting network in the porous substrate, the distance between the counter electrode and the light absorbing layer does no longer depend on the thickness of the porous substrate. Thus, the thickness of the insulating layer can be reduced, and by that the distance between the counter electrode and the light absorbing layer can be reduced. Accordingly, the resistive losses in the liquid electrolyte is reduced. Due to the fact that the distance between the counter electrode and the light absorbing layer does no longer depend on the thickness of the porous substrate, it is also possible to use a substrate that is thick enough for safe mechanical handling.

In one aspect, the first conducting layer 12' comprises an oxide layer 109 formed on the surface of the conducting material, as shown in the enlarged figure to the left in FIG. 3. This oxide layer is formed by oxidizing the conducting material of the first conducting layer. The conducting material suitably comprises a metal or a metal alloy, for example, titanium. The surface of the conducting material is oxidized when it is exposed to air. The oxide layer 109 can be formed by performing a heat treatment of the first conducting layer in an oxidizing environment so that the conducting material becomes oxidized. The insulating oxide 109 provides an electrically insulating layer on the conducting material, which at least partly prevents transfer of electrons between the first conducting layer and the liquid electrolyte.

In one aspect, the first conducting layer 12' comprises porous titanium, and a titanium oxide layer 109 formed on the surfaces of the porous titanium so that the oxide layer 109 electrically insulates the porous titanium of the first conducting layer and by that prevents electrons from leaking from the porous titanium in the first conducting layer to the liquid electrolyte in the pores of the first conducting layer. Thus, the efficiency of the solar cell unit is increased. For example, the first conducting layer comprises sintered titanium particles 107', and the surfaces of the sintered titanium particles are covered by a titanium oxide layer, as shown in the enlarged figure to the left in FIG. 3. In one aspect, the thickness of said titanium oxide layer is larger than 5 nm, preferably larger than 10 nm, and more preferably larger than 20 nm. In one aspect, the thickness of said titanium oxide layer is between 10 and 200 nm, and preferably between 20-50 nm.

In particular, the combination of the titanium oxide layer that prevents electrons from leaking from the first conducting layer to the liquid electrolyte, and a counter electrode comprising a conducting layer with a mixture of conducting particles and catalytic particles, and a conducting layer without catalytic particles, which improves the efficiency of the counter electrode, will result in efficient solar cell unit which is capable of producing power in a wide range of different light conditions. The solar cell unit works during poor as well as excellent lighting conditions, for example, indoors in artificial light, and outdoors in the shadow and when exposed to strong sunlight.

For example, the conducting medium is an ionic based electrolyte. In one aspect, the electrolyte is any of a liquid iodide/triiodide electrolyte, a liquid copper complex, or a liquid cobalt complex-based electrolyte, or a combination thereof. In one aspect, the conducting medium comprises iodide ($I^-$) and triiodide ($I_3^-$) and the content of triiodide in the conducting medium is between 1 mM and 20 mM. This embodiment makes it possible to achieve high power generation at low light intensities.

Figure 4:
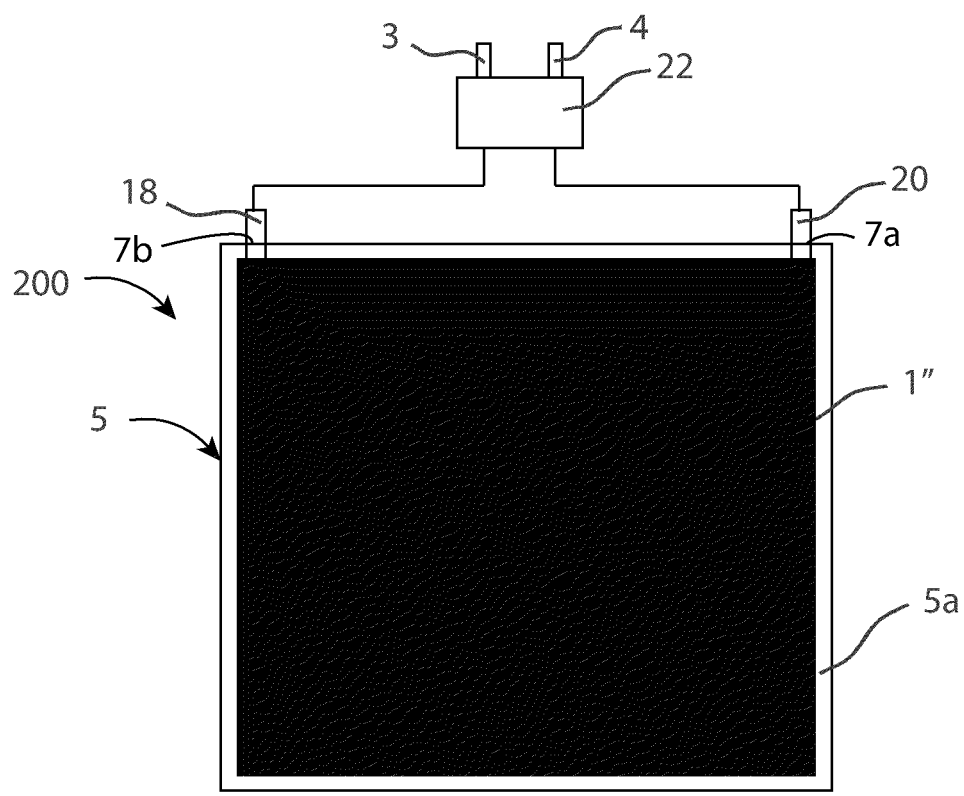
FIG. 4 shows a view from above of a photovoltaic charger in accordance with one or more embodiments of the invention.

FIG. 4 shows a view from above of an example of a photovoltaic charger 200. The photovoltaic charger 200 is specially adapted for powering portable electronic devices that can be used indoors as well as outdoors, such as earphones, laptops, tablets, mobile phones, and remote-control units. The photovoltaic charger 200 can also be used for powering small electronic devices embedded in other physical devices, such as vehicles, and home appliances, called Internet of Things (IoT).

The photovoltaic charger 200 comprises a solar cell unit 1'', an encapsulation 5 enclosing the solar cell unit 1'', a first conductor 18, and a second conductor 20. The photovoltaic charger may further comprise connection elements (not shown) for connecting the photovoltaic charger 200 to the electronic device. The solar cell unit 200 is a monolithic type DSC. The monolithic type of DSC differs from the standard DSC in that it is created on a single substrate, with multiple layer disposed on the substrate.

The encapsulation comprises a plurality of penetrations in connection to the first and second conductors for connecting the photovoltaic device to the external device. In other words, there are penetrations in the encapsulation for accessing the power produced by the photovoltaic device. Some kind of wiring will be going through the penetrations. For example, the first and second conductors may extend out of the encapsulation through the penetrations to connect to wiring for powering the external device. Alternatively, wires from the outside of the encapsulation are going through the penetrations and electrically connect to the first and second conductors. The penetrations are tightly fit around the wiring passing through the encapsulation such that no gas or liquid can pass through penetrations. For example, the penetrations are openings in the encapsulation tightly fit around wiring passing through the encapsulation.

The encapsulation 5 comprises a plurality of penetrations 7a-b arranged in connection to the first conductor 18 and the second conductor 20 for connecting the photovoltaic device 1 to the external device and by that access the power produced by the photovoltaic device. For example, the penetrations are lead trough openings in the encapsulation. Some kind of wiring will be going through the openings. For example, the first and second conductors 18, 20 may extend out of the encapsulation through the penetrations 7a-b to connect to wiring for powering the external device, as shown in FIG. 4. Alternatively, wires from the outside of the encapsulation are going through the penetrations and electrically connected to the first and second conductors. The penetrations are tightly fit around the wiring such that no gas or liquid can pass through them. The penetrations can be made by having the wires or conductors that should go through the holes in place when the encapsulation is arranged on the solar cell unit 1''. The top sheet 5a and bottom sheet 5b are, for example, adhesive films that are put together over the solar cell unit 1''. Alternatively, the top and bottom sheets are made of a flexible plastic material, and the edges of the top and bottom sheets are bonded to each other by melting the plastic material. If the wires/conductors are already in place between sheets before the bonding and protrude at the edges of the sheets, the penetrations will be created during the bonding. Alternatively, the penetrations comprise through holes in the encapsulation made after encapsulation of the solar cell unit. The trough holes are sealed after the wires/conductors have been arranged in the through holes. The locations of the penetrations will depend on the position of the first and second conductors. The number of penetrations can vary. There is at least one penetration for each of the first and second conductor. However, it is also possible to have a plurality of penetrations for each of the first and second conductors.

Figure 5:
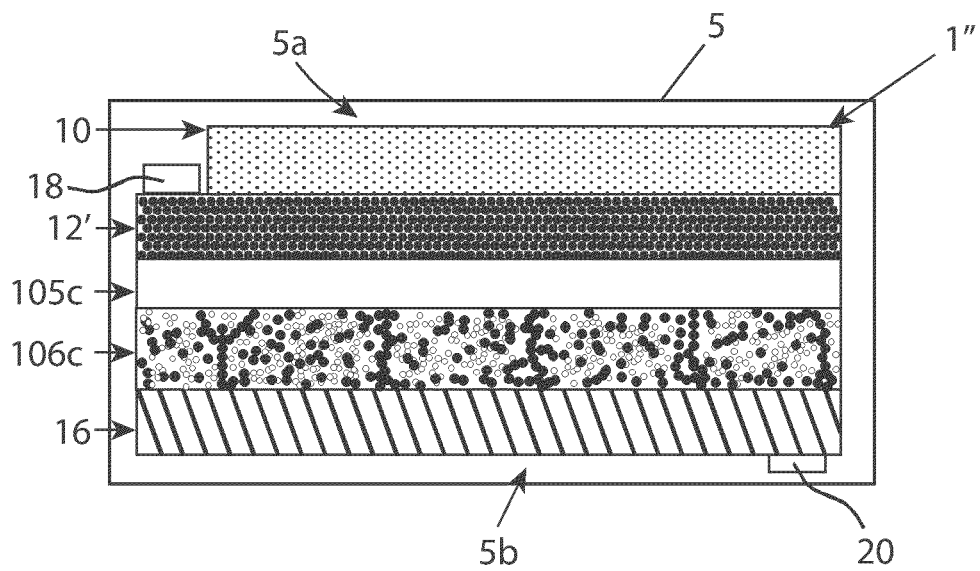
FIG. 5 shows a cross section through the photovoltaic charger shown in FIG. 1 in an enlarged view.

FIG. 5 shows an enlargement of a cross section through a part of the photovoltaic charger 200 shown in FIG. 4. The photovoltaic charger 200 comprises one solar cell unit 1'', which is describe in more details with reference to FIG. 3. For example, the light-absorbing layer 10 comprises dyed $TiO_2$. Conventional dyes known in the art can be used. A dye is chosen to give good efficiency of the solar cell, especially in combination with a copper-based conducting medium. The light-absorbing layer 10 is arranged on top of the first conducting layer 12'. The porous light-absorbing layer 10 is a porous $TiO_2$ layer deposited onto the first conducting layer 12'. The $TiO_2$ layer comprises $TiO_2$ particles dyed by adsorbing dye molecules on the surface of the $TiO_2$ particles. The light-absorbing layer 10 is positioned on a top side of the solar cell unit 1''. The top side should be facing the light to allow the light to hit the dye molecules of the working electrode.

The first conducting layer 12' is in direct electrical contact with the light-absorbing layer 10. In this example, the second conducting layer 16 is porous. However, in an alternative embodiment, the second conducting layer 16 does not have to be porous. For example, the second conducting layer can be made of a metal foil. In this example, the porous insulating layer 105c comprises at least a part of a porous substrate. The porous substrate provides electrical insulation between the first and third conducting layers 12', 106c. The first and third conducting layers are separated physically and electrically by the porous substrate. The porosity of the porous substrate will enable ionic transport through the insulating layer 105c. The porosity of the first and third conducting layers 12', 106c will enable ionic transport between the counter electrode and the working electrode.

The photovoltaic charger 200 contains only one single solar cell unit 1''. At least the first conducting layer 12' and the porous substrate are continuously extending through the entire solar cell unit. The light-absorbing layer 10 and the second conducting layer 16 extend continuously at least through a main part of solar cell unit.

The solar cell unit 1'' is filled with a liquid electrolyte for transferring charges between the counter electrode and the light-absorbing layer 10. The electrolyte is, for example, a conventional $I^-/I^{-3}$ electrolyte or a similar electrolyte, or a copper (Cu) based electrolyte, or cobalt (Co) complex based electrolyte. The electrolyte comprises ions, for example, iodide ions ($I^-$) and triiodide ions ($I_3^-$) or copper ions ($Cu^{2+}$ and $Cu^+$). Sunlight is harvested by the dye, producing photo-excited electrons that are injected into the conduction band of the $TiO_2$ particles and further collected by the first conducting layer. At the same time, ions in the electrolyte transport the electrons from the second conducting layer to the light-absorbing layer 10. The first conductor 18 collects the electrons from the first conducting layer and the second conductor provides electrons to the second conducting layer such that the solar cell unit can continuously produce power from the incoming photons.

The electrolyte penetrates the pores of the light-absorbing layer 10, the first conducting layer 12', the porous insulating layer 105c, the second conducting layer 16 and the third conducting layer 106c to allow the ions to be transferred between the light-absorbing layer 10 and the second conducting layer 106c and by that transfer electrons from the working electrode to the light-absorbing layer.

There are many dyes that may be used and according to some aspects, the dye comprises triarylamine organic dye comprising any of, or a mixture of, dyes in the class Donor-π bridge-Acceptor (D-π-A) and in the class Donor-Acceptor-π bridge-Acceptor (D-A-π-A). Such dyes give good efficiency of the solar cell, especially in combination with a copper-based conducting medium. Of the first-class photosensitizer are, for example, substituted (diphenylaminophenyl)-thiophene-2-cyanoacrylic acids or substituted (diphenylaminophenyl)cyclopenta-dithiophene-2-cyanoacrylic acids. Of the second class are, for example, substituted (((diphenylaminophenyl)benzothia-diazolyl)-cyclopentadithiophenyl)aryl/heteroaryl-2-cyanoacrylic acids or (((diphenyl-aminophenyl)-cyclopentadithiophenyl)benzothiadiazolyl)aryl/heteroaryl-2-cyano-acrylic acids.

The first conductor 18 is electrically connected to the first conducting layer 12', and the second conductor 20 is electrically connected to the second conducting layer 16. For example, the first and second conductors are made of metal to achieve high electrical conductivity.

The encapsulation 5 comprises a top sheet 5a covering a top side of the solar cell unit 1', and a bottom sheet 5b covering a bottom side of the solar cell unit. The encapsulation 5 encloses the solar cell unit and the electrolyte and acts as liquid barrier for the electrolyte and prevents the electrolyte from leaking from the photovoltaic charger 200. The top sheet 5a is transparent, or at least the part covering the active area of the solar cell unit 1" is transparent. The top sheet 5a on the top side of the solar cell unit covers the light-absorbing layer 10 and allows light to pass through. The top and bottom sheets 5a-b are, for example, made of a polymer material. A polymer material is robust and impact resistant, and flexible. The top and bottom sheets 5a-b are sealed at the edges in order to protect the solar cell unit against the surrounding atmosphere, and to prevent the evaporation or leakage of the electrolyte from the inside the solar cell unit.

In one example, the porous substrate is a sheet comprising a fabric of woven microfibers. A microfiber is a fibre having a diameter less than 10 μm and larger than 1 nm. A fabric of woven microfibers can be made very thin and mechanically very strong. The fabric of woven microfibers contains holes between the woven yarns. The porous substrate may further comprise one or more layers of non-woven microfibers disposed on the woven microfibers to at least partly block the holes between the yarns. Further, the non-woven layer provides a smooth surface on the substrate, suitable for applying a smooth conducting layer on the substrate by printing. The substrate is, for example, made glass, silica ($SiO_2$), alumina ($Al_2O_3$), aluminosilicate or quartz. Suitably, the non-woven and woven microfibers of the porous substrate are made of glass fibres, which provides a robust and flexible substrate. The thickness of the fabric of woven microfibers is suitably between 4 μm and 30 μm, preferably between 4 μm and 20 μm to provide the required mechanical strength at the same time as it is thin enough to enable a fast transport of ions between the counter electrode and working electrode.

In one aspect, light-absorbing layer 10, and the first conducting layer 12' are non-transparent. In this example, the upper surface of the solar cell unit 1" is homogeneously black, as shown in FIG. 4. The $TiO_2$ of the light-absorbing layer is black. There are no conductors extending across the surface of the solar cell unit 1" as it is in the prior art solar cell panels. This is because the photovoltaic charger 200 only contains one single solar cell unit, and not a plurality of series connected solar cell units, as in the solar panels used in the prior art photovoltaic chargers.

The size of the solar cell unit, i.e. the length and width of the solar cell unit, may vary depending on which device it is adapted to charge. Accordingly, the active area of the solar cell unit may vary depending on the need of power for the device to charge. There is no limit to the possible shape and size of the solar cell unit. For example, the size of the solar cell unit may vary between 1×1 cm with an active area of 1 $cm^2$ and 1×1 m with an active area of 1 $m^2$. There is no upper limit to the length and width of the solar cell unit. However, a solar cell unit larger than 1×1 m can be bulky to handle during manufacturing of the solar cell unit.

The photovoltaic charger 1 includes a single solar cell unit 1" and a boost converter 22 electrically connected to the first and second conductors 18, 20. A boost converter, also called step-up converter or step-up regulator, is a DC-to-DC power converter that steps up voltage while stepping down current from its input to its output. The voltage produced by the single solar cell unit is too low to charge certain types or batteries, for example, lithium batteries that require at least 3.6 V. The boost converter is adapted to step up the voltage from the solar cell unit 1" while stepping down the current from the solar cell unit. The required voltage level is achieved by connecting a boost converter to the single solar cell unit. Thus, it is possible to provide a photovoltaic charger having only one single solar cell unit capable to charge batteries that require different voltage levels.

The photovoltaic charger 211 comprises connection elements 3, 4 for connecting the photovoltaic charger 1 to a battery of the electronic device, which it is charging. The boost converter 22 comprises input terminals electrically connected to the first and second conductors 18, 20 and output terminals electrically connected to the connection elements 3, 4.

The level of the generated voltage depends on the ions in the electrolyte. For example, if the electrolyte contains copper ions, the solar cell unit generates a voltage of about 1 V in an open circuit when the light intensity received by the light-absorbing layer is 20 000 Lux, and if the electrolyte contains iodide and triiodide ions, the solar cell unit generates a voltage of about 0.65 V in an open circuit when the light intensity received by the light-absorbing layer is 20 000 Lux. However, the solar cell unit 1" generates a voltage varying at most 0.4 V in an open circuit when the light intensity received by the light-absorbing layer is varying between 200 and 20 000 Lux. The requirement on the voltage conversion of the boost converter depends on the voltage requirement of the rechargeable battery. Most types of rechargeable batteries used for electronic devices for consumer applications require a voltage between 1 and 10 V. The boost converter makes it possible to generate a stable voltage at a level required by the rechargeable battery. Preferably, the boost converter 22 is capable to convert the output voltage and current from the solar cell unit to a voltage level that lies between 1 and 10 V. Different boost converters can be used depending on the required output voltage. Thus, the photovoltaic charger is capable to charge batteries used for many types of electronic devices, such as lithium batteries (3.6V), NiCd and NiMH batteries (1.25 V).

From tests it has been shown that the solar cell unit is capable to produce a current of at least 15 $\mu A/cm^2$ when the light intensity received by the light-absorbing layer is 200 Lux, and a current of at least 1500 $\mu A/cm^2$ when the light intensity received by the light-absorbing layer is 20 000 Lux. Thus, the solar cell unit is capable to produce sufficient power to charge batteries of electronic devices in a wide range of light intensities.

According to some aspects, at least the first conducting layer 12' and the porous substrate 114 are continuously extending through the entire solar cell unit 1". The light-absorbing layer 10 and the second conducting layer 16 extend continuously at least through a main part of the solar cell unit.

Measurements of generated power per area for different light conditions have been made on an example of a photovoltaic charger of the invention including one single solar cell unit 1". In this example, the solar cell unit 1" has a size of 14.5×23.4 cm, and an active area of 340 $cm^2$. The electrolyte of the solar cell unit 1" comprises iodide and triiodide ions, and the first and second conducting layers are made of titanium (Ti). The unloaded photovoltaic charger is exposed with light between 200 and 20 000 Lux (lumen per square meter), and the output voltage and output current from the photovoltaic charger is measured. The results of the measurements are shown in table 1 below. The total power generated is determined based on the measured current and voltage, and the generated power per area is determined by dividing the total power with the active area of the solar cell unit.

TABLE 1

Measurements of generated power per active area, current per active area, voltage and fill factors (ff) for light intensities between 200-20 000 Lux for a solar cell unit 1" having an electrolyte comprising iodide ($I^-$) and triiodide ($I_3^-$) ions. The content of triiodide is between 1 mM and 20 mM. Iodide works as ox and triiodide works as red.

| Lux | µW/cm2 | I sc (µA/cm2) | Voc (mV) | ff (%) |
| --- | --- | --- | --- | --- |
| 200 | 6.2 | 18 | 483 | 72 |
| 500 | 18 | 44 | 521 | 77 |
| 1000 | 37 | 90 | 542 | 76 |
| 2000 | 80 | 179 | 565 | 79 |
| 3000 | 123 | 266 | 576 | 80 |
| 5000 | 208 | 445 | 591 | 79 |
| 6000 | 249 | 531 | 600 | 78 |
| 10000 | 405 | 880 | 614 | 75 |
| 20000 | 730 | 1700 | 650 | 69 |

The measurements of the performance of the solar cell unit 1" at different light intensities (intensities measured in Lux units) can be done by shining light on the solar cell unit, and simultaneously scanning an applied electrical voltage across the solar cell unit to measure and collect the current-voltage response of the solar cell. The measurements were performed using a warm-white LED as light source.

The collected IV curve under illumination provides information about the open circuit voltage, short circuit current, fill factor, the power and the power conversion efficiency. By collecting IV curves at different light intensities, it is possible to gather information on the light intensity dependence of the open circuit voltage, short circuit current, fill factor the power and the power conversion efficiency, respectively.

The result from table 1 is from measurements on a sample of a solar cell unit 1". Measurements on different solar cell units of this type may vary. For example, the generated power per area may from 5 $\mu W/cm^2$ to 8 $\mu W/cm^2$.

The light source used for shining light on the solar cell can vary depending on the solar cell application. For indoor applications it could be useful to use fluorescent light bulbs or indoor LED lighting. For solar cell applications that use outdoor light it could be useful to shine light on the solar cell using a solar simulator to generate artificial sunlight.

The light intensity of the light source can be measured in different ways, for example, using a lux meter or a spectroradiometer positioned at the same position as the solar cell unit in relation to the light source. In this case, the light intensity was measured using a lux meter.

Table 1 shows the determined power in microwatt per square centimetre ($\mu W/cm^2$) for different light intensities measured in lux. As seen from the table, the solar cell unit 1" generates 6.2 $\mu W/cm^2$ when the light intensity received by the solar cell unit 1" is 200 Lux, generates 208 $\mu W/cm^2$ when the light intensity received by the solar cell unit 1" is 5000 Lux, and generates 730 $\mu W/cm^2$ when the light intensity received by the solar cell unit 1" is 20 000 Lux. This shows that the photovoltaic charger is capable of producing more than 5 $\mu W/cm^2$, and even more than 5.5 $\mu W/cm^2$ when the light intensity received by the light-absorbing layer is 200 Lux. This also shows that the photovoltaic charger is capable of producing more than 700 $\mu W/cm^2$ when the light intensity received by the light-absorbing layer is 20 000 Lux. Thus, the solar cell unit 1" is at least capable of producing between 5.5 and 700 $\mu W/cm^2$ when the light intensity received by the light-absorbing layer is between 200 and 20 000 Lux. The power produced by the photovoltaic charger increases substantially linear when the light intensity received by the light-absorbing layer increases from 200 to 20 000 Lux. Thus, the photovoltaic charger is capable of producing power in a wide range of different light conditions.

Figure 6:
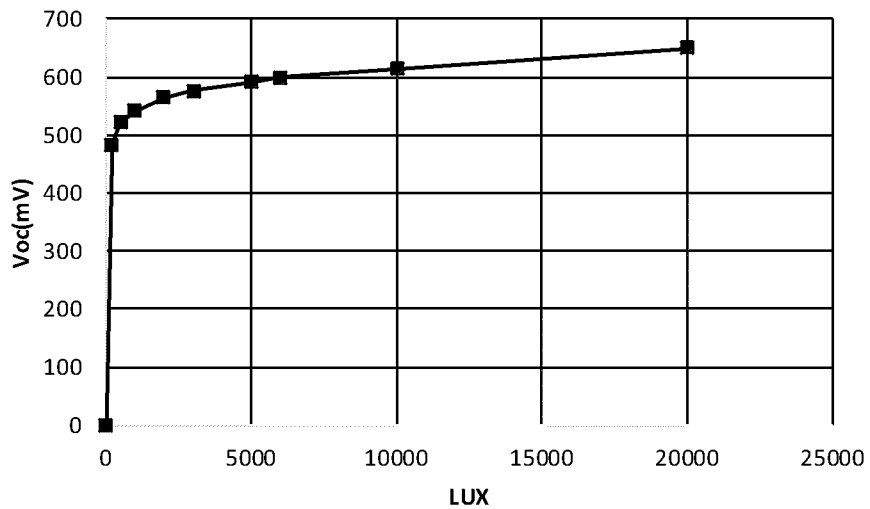
FIG. 6 shows a diagram of measured values for generated voltage (mV) for light intensities between 200 and 20 000 Lux for the third example of a solar cell unit having an electrolyte comprising iodide and triiodide ions.

FIG. 6 shows a diagram of generated voltage (mV) for light intensities between 200 and 20 000 Lux based on the measured values of table 1. As seen from the diagram and table 1, the solar cell unit 1" is capable to generate a voltage of 480 mV in an open circuit when the light intensity received by the solar cell unit 1" is 200 Lux. Further, the photovoltaic charger is capable to generate a voltage of 650 mV in an open circuit when the light intensity received by the solar cell unit 1" is 20 000 Lux. As seen from the diagram, the increase of generated voltage is largest between 200 and 3000 Lux. The generated voltage is substantially linear between 3000 and 20 000 Lux. As seen from the table 1, the difference in generated voltage between 200 and 20 000 Lux is only 167 mV. Thus, the solar cell unit 1" generates a voltage varying less than 0.2 V in an open circuit when the light intensity received by the light-absorbing layer is varying between 200 and 20 000 Lux. Accordingly, the difference in generated voltage between 200 and 20 000 Lux is about 35%.

Figure 7:
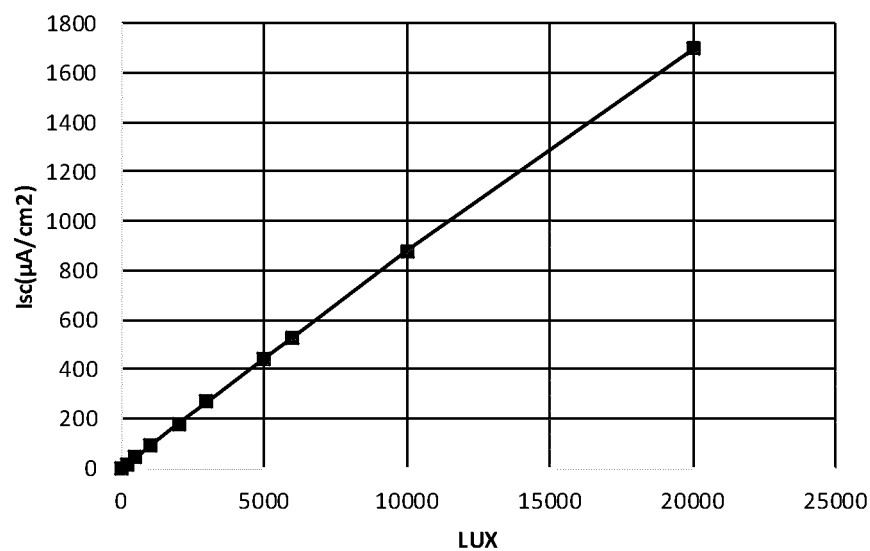
FIG. 7 shows a diagram based on measured values for generated current ($\mu A/cm^2$) for light intensities between 200 and 20 000 Lux for the third example of the solar cell unit.

FIG. 7 shows a diagram of generated current ($\mu A/cm^2$) for light intensities between 200 and 20 000 Lux based on the measured values of table 1. As seen from the figure, the current increase linearly.

Figure 8:
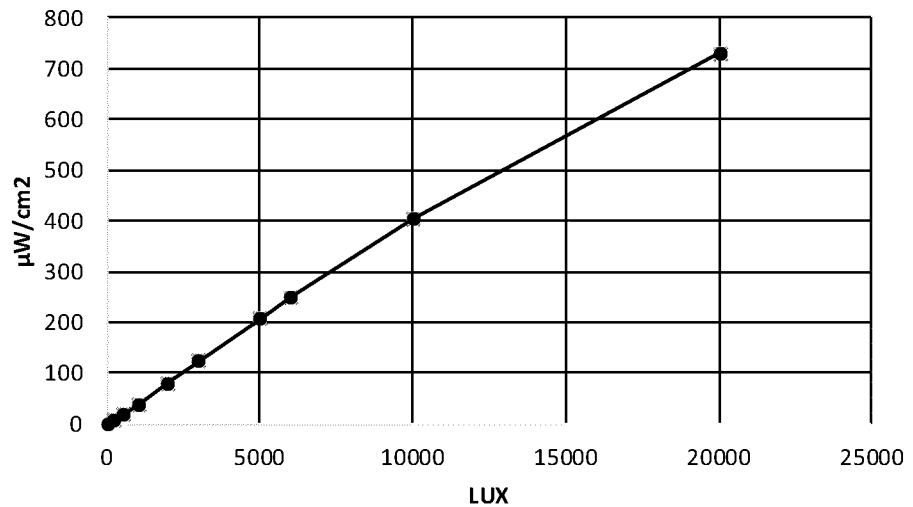
FIG. 8 shows a diagram based on measured values for generated power per area ($\mu W/cm^2$) for light intensities between 200 and 20 000 Lux for the third example of the solar cell unit having an electrolyte comprising iodide and triiodide ions.

FIG. 8 shows a diagram of generated power per area ($\mu W/cm^2$) for light intensities between 200 and 20 000 Lux calculated based on the measured values of voltage and current of table 1. As seen from the diagram, the measured power is substantially proportional to the incoming light intensity in the interval 200-20 000 Lux.

Further measurements of generated power per area for different light conditions have been made on another example of a photovoltaic charger of the invention. In this example, the electrolyte of the solar cell unit 1" comprises copper ions ($Cu^+$ and $Cu^{2+}$), which is the only difference between the photovoltaic chargers measured. The measurement conditions were the same. The unloaded photovoltaic charger is exposed with light between 200 and 20 000 Lux (lumen per square meter), and the output voltage and output current from the photovoltaic charger is measured. The result of the measurements is shown in the table 2 below.

TABLE 2

Measurements of generated power per area, current per area, voltage and fill factor (ff) for light intensities between 200-20 000 Lux for a solar cell unit 1" having an electrolyte comprising copper ions; $Cu^+$ as red and $Cu^{2+}$ as ox.

| Lux | μW/cm2 | I sc (μA/cm2) | Voc (mV) | ff (%) |
| --- | --- | --- | --- | --- |
| 0 | 0 | 0 | 0 | 0 |
| 200 | 12.8 | 25 | 699 | 72.7 |
| 500 | 38 | 67 | 762 | 74.3 |
| 1000 | 85.4 | 140 | 800 | 76.1 |
| 2000 | 186 | 290 | 835 | 77.1 |
| 5000 | 498 | 737 | 881 | 76.6 |
| 10000 | 1020 | 1490 | 915 | 75.1 |
| 20000 | 2020 | 2960 | 943 | 72.3 |
| 30000 | 2920 | 4390 | 954 | 69.7 |
| 40000 | 3720 | 5750 | 958 | 67.6 |
| 50000 | 4410 | 7000 | 958 | 65.8 |

As seen from the table 2, the solar cell unit 1" generates 12.8 $\mu W/cm^2$ when the light intensity received by the solar cell unit 1" is 200 Lux, generates 498 $\mu W/cm^2$ when the light intensity received by the solar cell unit 1" is 5000 Lux, and generates 2020 $\mu W/cm^2$ when the light intensity received by the solar cell unit 1" is 20 000 Lux. This shows that this photovoltaic charger is capable of producing more than 12 $\mu W/cm^2$ when the light intensity received by the light-absorbing layer is 200 Lux. This also shows that the photovoltaic charger is capable of producing more than 2000 $\mu W/cm^2$ when the light intensity received by the light-absorbing layer is 20 000 Lux. The power produced by the photovoltaic charger increases substantially linear when the light intensity received by the light-absorbing layer increases from 200 to 20 000 Lux. Thus, the photovoltaic charger is capable of producing power in a wide range of different light conditions.

Figure 9:
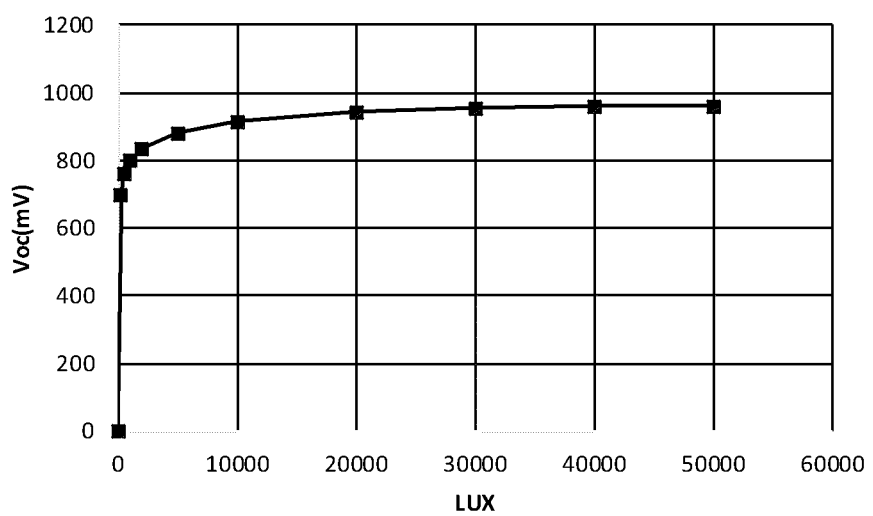
FIG. 9 shows a diagram of measured values for generated voltage (mV) for light intensities between 200 and 50 000 Lux for a third example of a solar cell unit having an electrolyte comprising copper ions.

FIG. 9 shows a diagram of generated voltage (mV) for light intensities between 200 and 50 000 Lux based on the measured values of table 2. As seen from the diagram and table 2, the solar cell unit 1" is capable of generating a voltage of 699 mV in an open circuit when the light intensity received by the solar cell unit 1" is 200 Lux. Further, the photovoltaic charger is capable to generate a voltage of 943 mV in an open circuit when the light intensity received by the solar cell unit 1" is 20 000 Lux. As seen from the diagram, the generated voltage is substantially linear between 3000 and 50 000 Lux. As seen from the table 2, the difference in generated voltage between 200 and 20 000 Lux is only 244 mV. Accordingly, the difference in generated voltage between 200 and 20 000 Lux is about 35%. The difference in generated voltage between 200 and 50 000 Lux is only 259 mV. Thus, the solar cell unit 1" generates a voltage varying less than 300 mV in an open circuit when the light intensity received by the light-absorbing layer is varying between 200 and 50 000 Lux. Accordingly, the difference in generated voltage between 200 and 50 000 Lux is about 37%.

Figure 10:
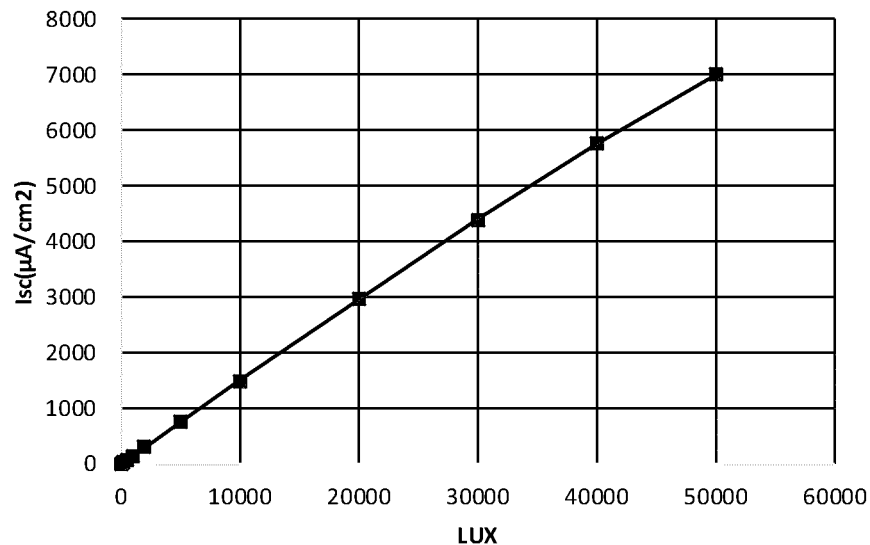
FIG. 10 shows a diagram based on measured values for generated current ($\mu A/cm^2$) for light intensities between 200 and 50 000 Lux for the third example of the solar cell unit having an electrolyte comprising copper ions.

FIG. 10 shows a diagram of generated current ($\mu A/cm^2$) for light intensities between 200 and 50 000 Lux based on the measured values of table 2. As seen from the figure, the current increases linearly.

Figure 11:
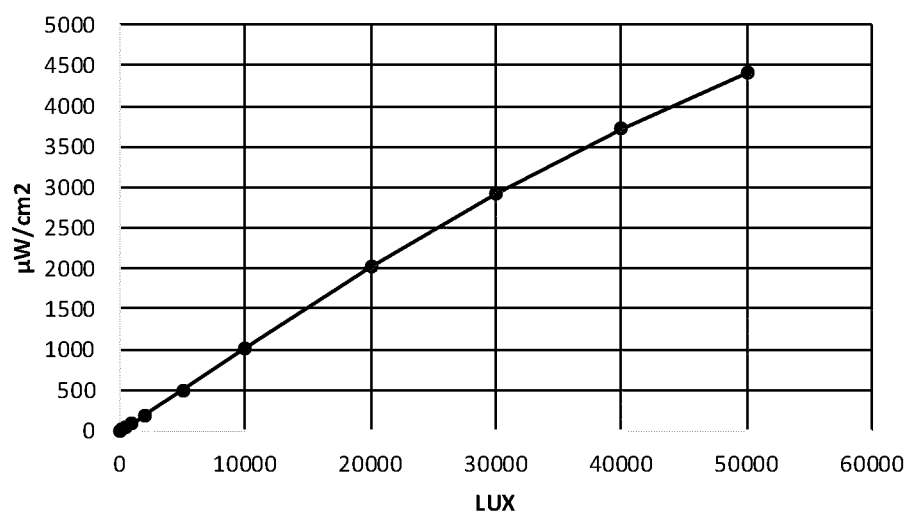
FIG. 11 shows a diagram based on measured values for generated power per area ($\mu W/cm^2$) for light intensities between 200 and 50 000 Lux for the third example of solar cell unit having an electrolyte comprising copper ions.

FIG. 11 shows a diagram of generated power per area ($\mu W/cm^2$) for light intensities between 200 and 50 000 Lux calculated based on the measured values of voltage and current of table 1. As seen from the diagram, the measured power is substantially proportional to the incoming light intensity in the interval 200-20 000 Lux.

The invention claimed is:

1. A dye-sensitized solar cell unit comprising:
   a working electrode comprising a light-absorbing layer,
   a porous first conducting layer for extracting photo-generated electrons from the light-absorbing layer, wherein the light-absorbing layer is arranged on top of the first conducting layer,
   a porous insulating layer made of an insulating material, wherein the porous first conducting layer is arranged on top of the porous insulating layer,
   a counter electrode comprising:
   (i) a second conducting layer including conducting material, and
   (ii) a porous third conducting layer disposed between the porous insulating layer and the second conducting layer, and in electrical contact with the second conducting layer, and
   a liquid electrolyte for transferring electrons from the counter electrode to the working electrode, wherein
   the third conducting layer comprises catalytic particles for improving the transfer of electrons to the liquid electrolyte,
   the first conducting layer comprises porous titanium,
   a titanium oxide layer is formed on the surfaces of the porous titanium, and
   the thickness of said titanium oxide layer is between 10 and 200 nm.

2. The dye-sensitized solar cell unit according to claim 1, wherein said catalytic particles comprises carbon.

3. The dye-sensitized solar cell unit according to claim 1, wherein said catalytic particles comprises platinized carbon particles.

4. The dye-sensitized solar cell unit according to claim 1, wherein the third conducting layer comprises a mixture of conducting particles and said catalytic particles, and the conducting particles are is in electrical contact with the second conducting layer.

5. The dye-sensitized solar cell unit according to claim 4, wherein said conducting particles of the third conducting layer are made of titanium.

6. The dye-sensitized solar cell unit according to claim 5, wherein said third conducting layer comprises a mixture of said titanium particles and platinized carbon particles.

7. The dye-sensitized solar cell unit according to claim 4, wherein said mixture comprises at least 10% by weight of catalytic particles.

8. The dye-sensitized solar cell unit according to claim 1, wherein the catalytic particles are substantially evenly distributed in the third conducting layer.

9. The dye-sensitized solar cell unit according to claim 1, wherein at least 80% of said catalytic particles have a diameter less than 50 nm.

10. The dye-sensitized solar cell unit according to claim 1, wherein the thickness of said titanium oxide layer is between 20-50 nm.

11. The dye-sensitized solar cell unit according to claim 1, wherein the thickness of the third conducting layer is at least 1 µm.

12. The dye-sensitized solar cell unit according to claim 1, wherein the electrolyte is any of a liquid iodide/triiodide electrolyte, a liquid copper complex, or a liquid cobalt complex based electrolyte, or a combination thereof.

13. The dye-sensitized solar cell unit according to claim 1, wherein the solar cell unit produces at least 5 µW/cm$^2$ when the light intensity received by the light-absorbing layer is 200 Lux, and at least 600 µW/cm$^2$ when the light intensity received by the light-absorbing layer is 20 000 Lux.

14. The dye-sensitized solar cell unit according to claim 1, wherein the solar cell unit produces at least 150 µW/cm$^2$ when the light intensity received by the light-absorbing layer is 5 000 Lux.

15. The dye-sensitized solar cell unit according to claim 1, wherein the solar cell unit generates a voltage varying less than 40% when the light intensity received by the light-absorbing layer is varying between 200 and 50 000 Lux.

16. The dye-sensitized solar cell unit according to claim 1, wherein the solar cell unit produces a current of at least 15 µA/cm$^2$ when the light intensity received by the light-absorbing layer is 200 Lux, and the current produced by the solar cell unit is linearly increasing when the light intensity received by the light-absorbing layer increases from 200 to 20 000 Lux.

17. A photovoltaic charger specially adapted for charging an electronic device, comprising:
   a dye-sensitized solar cell unit according to claim 1,
   an encapsulation encapsulating the solar cell unit,
   a first conductor electrically connected to the first conducting layer, and
   at least one second conductor electrically connected to the second conducting layer, wherein the photovoltaic charger contains only one single solar cell unit and a boost converter electrically connected to the first and second conductors, and the boost converter is adapted to step up the voltage from the solar cell unit while stepping down the current from the solar cell unit.

18. The photovoltaic charger according to claim 17, wherein the boost converter is configured to convert the voltage from the solar cell unit to a voltage that lies between 1 and 10 V.

19. The dye-sensitized solar cell unit according to claim 7, wherein said mixture comprises at least 20% by weight of catalytic particles.

20. The dye-sensitized solar cell unit according to claim 11, wherein the thickness of the third conducting layer is at least 5 µm.

21. The dye-sensitized solar cell unit according to claim 20, wherein the thickness of the third conducting layer is at least 10 µm.

\* \* \* \* \*